(12) United States Patent
Kadota

(10) Patent No.: US 7,626,314 B2
(45) Date of Patent: Dec. 1, 2009

(54) SURFACE ACOUSTIC WAVE DEVICE

(75) Inventor: Michio Kadota, Kyoto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 12/477,282

(22) Filed: Jun. 3, 2009

(65) Prior Publication Data
US 2009/0237181 A1 Sep. 24, 2009

Related U.S. Application Data

(63) Continuation of application No. PCT/JP2007/074018, filed on Dec. 13, 2007.

(30) Foreign Application Priority Data
Dec. 27, 2006 (JP) .............................. 2006-352091

(51) Int. Cl.
*H01L 41/04* (2006.01)
*H03H 9/145* (2006.01)
(52) U.S. Cl. ................................ 310/313 A; 310/313 B
(58) Field of Classification Search .................. 310/313
See application file for complete search history.

(56) References Cited

U.S. PATENT DOCUMENTS

| 6,154,105 | A | | 11/2000 | Fujimoto et al. | |
|---|---|---|---|---|---|
| 6,163,099 | A | * | 12/2000 | Kadota et al. | ............ 310/313 A |
| 6,369,667 | B1 | | 4/2002 | Kadota et al. | |
| 6,377,138 | B1 | | 4/2002 | Takagi et al. | |
| 6,710,509 | B1 | * | 3/2004 | Kadota | .................... 310/313 A |
| 6,717,327 | B2 | * | 4/2004 | Kando et al. | ............ 310/313 A |
| 6,937,116 | B2 | * | 8/2005 | Takagi et al. | ................. 333/195 |
| 7,310,027 | B2 | * | 12/2007 | Kando | ......................... 333/133 |

(Continued)

FOREIGN PATENT DOCUMENTS

JP 61136312 A * 6/1986

(Continued)

OTHER PUBLICATIONS

Official Communication issued in International Patent Application No. PCT/JP2007/074018, mailed on Apr. 8, 2008.

(Continued)

*Primary Examiner*—J. SanMartin
(74) *Attorney, Agent, or Firm*—Keating & Bennett, LLP

(57) ABSTRACT

A surface acoustic wave device which uses a Rayleigh wave as a surface acoustic wave includes an IDT electrode provided on a piezoelectric substrate composed of quartz having Euler angles of (0°±5°, 0° to 140°, 0°±40°), a piezoelectric film composed of c-axis oriented ZnO arranged so as to cover the IDT electrode, and the piezoelectric film has a convex portion provided on a surface thereof corresponding to the thickness of the ID electrode. The IDT electrode is composed of a metal material primarily including Al, Au, Ta, W, Pt, Cu, Ni, or Mo, and when the wavelength of the surface acoustic wave is represented by $\lambda$, the primary metal of the IDT electrode, a normalized thickness of the IDT electrode normalized by the wavelength of the surface acoustic wave, and a normalized thickness of the piezoelectric film normalized by the wavelength of the surface acoustic wave are preferably set within the ranges of each combination shown in Table 1.

7 Claims, 13 Drawing Sheets

U.S. PATENT DOCUMENTS

| | | | |
|---|---|---|---|
| 7,336,016 B2 * | 2/2008 | Oshio ..................... | 310/313 B |
| 7,411,334 B2 * | 8/2008 | Nishiyama et al. ...... | 310/313 R |
| 7,418,772 B2 * | 9/2008 | Nishiyama et al. ......... | 29/25.35 |
| 7,425,788 B2 * | 9/2008 | Kadota et al. ........... | 310/313 B |
| 2003/0020366 A1 * | 1/2003 | Kando .................... | 310/313 D |
| 2008/0084134 A1 * | 4/2008 | Morita et al. ........... | 310/313 A |
| 2009/0021108 A1 * | 1/2009 | Owaki et al. ............ | 310/313 D |

FOREIGN PATENT DOCUMENTS

| | | |
|---|---|---|
| JP | 01-292908 A | 11/1989 |
| JP | 11-298290 A | 10/1999 |
| JP | 2000-323956 A | 11/2000 |
| JP | 2002-280856 A | 9/2002 |
| JP | 2003-037467 A | 2/2003 |
| JP | 2005-142629 A | 6/2005 |
| JP | 2006-121259 A | 5/2006 |
| WO | 99/05788 A1 | 2/1999 |

OTHER PUBLICATIONS

Kadota et al., "Small and Low-Loss if Saw Filters Using Zinc Oxide Film on Quartz Substrate," 31st EM Symposium, May 2002, pp. 87-94.

* cited by examiner

ZnO/Ni/(0°, 117°, 0°)QUARTZ

ZnO/Pt/(0°, 117°, 0°)QUARTZ

ZnO/Cu/(0°, 117°, 0°) QUARTZ

ZnO/Mo/(0°, 117°, 0°) QUARTZ

SURFACE ACOUSTIC WAVE DEVICE

BACKGROUND OF THE INVENTION

1. Field of the Invention

The present invention relates to a surface acoustic wave device for use as a bandpass filter, a resonator, or the like, and more particularly relates to a surface acoustic wave device including at least one IDT electrode and a piezoelectric film composed of ZnO, which are laminated on a piezoelectric substrate composed of quartz.

2. Description of the Related Art

Heretofore, various surface acoustic wave devices have been proposed using various piezoelectric materials. For example, in "Small and Low-loss Filter Using ZnO Film/Quartz Structure" 31th EM Symposium, pp. 87 to 94 (May 2002), a small surface acoustic wave filter having the structure in which a ZnO film and quartz are laminated to each other has been disclosed. In this document, a transversal type surface acoustic wave filter has been disclosed in which at least one IDT electrode composed of Al is formed on a piezoelectric substrate composed of 27° Y-cut X-propagation quartz, and in which a piezoelectric film composed of ZnO is laminated so as to cover the IDT electrode. A thickness H/λ of the IDT electrode normalized by the wavelength of a surface acoustic wave is set to 0.02. A normalized thickness H/λ of the piezoelectric film composed of ZnO is set to 0.3, and accordingly, a 380-MHz bandpass filter in the IF stage of WCDMA mobile phones is formed.

As disclosed in the above mentioned document, heretofore, a laminate structure of ZnO/IDT electrode/quartz has been studied for application to a transversal surface acoustic wave filter device.

In the meantime, as the surface acoustic wave device, besides a transversal surface acoustic wave filter, a surface acoustic wave resonator using reflection of a surface acoustic wave at an electrode and a resonator type surface acoustic wave device, such as a surface acoustic wave resonator type filter, have been known. However, the application of the structure of ZnO/IDT electrode/quartz to a resonator type surface acoustic wave filter device has not been sufficiently studied.

In recent years, as a bandpass filter of a mobile phone, a bandpass filter has been desired which has a narrow bandwidth with a fractional bandwidth of approximately 1% and has superior selectivity. For example, in video broadcasting service for mobile phones, a bandpass filter has been desired which has a center frequency of 700 MHz and a bandwidth of 6 MHz (fractional bandwidth of 0.85%). It has been very difficult for a transversal surface acoustic wave filter to realize a bandpass filter having a narrow bandwidth and superior selectivity as described above. In addition, even by a longitudinal coupling resonator type surface acoustic wave filter using $LiTaO_3$, $LiNbO_3$, or quartz as a piezoelectric substrate, the bandwidth as described above has been difficult to be realized.

In a resonator type surface acoustic wave device, in the case in which a wavelength determined by the pitch of an IDT electrode is represented by λ, a phase velocity on a piezoelectric substrate when an IDT portion is in an electrical open state is represented by V, V-Vm is represented by ΔV in which Vm indicates a phase velocity when the IDT portion is in a short-circuit state, a center frequency is represented by F, and a bandwidth is represented by ΔF, an electromechanical coupling coefficient $K^2$ satisfies the following equation (1).

$$K^2/2 = |\Delta V|/V = |\Delta V/\lambda|/(V/\lambda) \alpha |\Delta F|/F \quad \text{Equation (1)}$$

When the resonator type surface acoustic wave filter device is miniaturized while the above fractional bandwidth of 0.85% is maintained, it is necessary to increase a reflection coefficient of electrode fingers of the IDT electrode. However, heretofore, in the resonator type surface acoustic wave filter device, it has been difficult to sufficiently increase the reflection coefficient, and hence a resonator type surface acoustic wave filter which can satisfy the demands as described above has not been realized.

SUMMARY OF THE INVENTION

Preferred embodiments of the present invention provide a resonator type surface acoustic wave device that increases the reflection coefficient of electrode fingers of an IDT electrode and provides a narrow fractional bandwidth.

According to a preferred embodiment of the present invention, a surface acoustic wave device which uses a Rayleigh wave as a surface acoustic wave, includes: a piezoelectric substrate composed of quartz having Euler angles of (0°±5°, 0° to 140°, and 0°±40°); an IDT electrode located on the piezoelectric substrate and which includes a plurality of electrode fingers; and a piezoelectric film arranged on the piezoelectric substrate so as to cover the IDT electrode and which is composed of c-axis oriented ZnO, the piezoelectric film having a convex portion provided on a surface thereof corresponding to the thickness of the IDT electrode. In the surface acoustic wave device described above, the IDT electrode is composed of a metal material primarily including at least one metal selected from the group consisting of Al, Au, Ta, W, Pt, Cu, Ni, and Mo, and when the wavelength of the surface acoustic wave is represented by λ, the primary metal of the IDT electrode, a normalized thickness of the IDT electrode normalized by the wavelength of the surface acoustic wave, and a normalized thickness of the piezoelectric film normalized by the wavelength of the surface acoustic wave are preferably set within the ranges of each combination shown in the following Table 1. In this case, the absolute value of the reflection coefficient of the surface acoustic wave per electrode finger of the IDT electrode can be increased to about 0.025 or more.

TABLE 1

| Primary metal of IDT electrode | Normalized thickness of IDT electrode | Normalized ZnO thickness |
| --- | --- | --- |
| Al | 0.02 ≦ h/λ ≦ 0.2 | 0.03 ≦ h/λ ≦ 0.3 |
| Au | 0.005 ≦ h/λ ≦ 0.2 | 0.03 ≦ h/λ ≦ 0.3 |
| Ta | 0.005 ≦ h/λ ≦ 0.2 | 0.03 ≦ h/λ ≦ 0.3 |
| W | 0.005 ≦ h/λ ≦ 0.2 | 0.03 ≦ h/λ ≦ 0.3 |
| Pt | 0.005 ≦ h/λ ≦ 0.2 | 0.03 ≦ h/λ ≦ 0.3 |
| Cu | 0.02 ≦ h/λ ≦ 0.2 | 0.03 ≦ h/λ ≦ 0.3 |
| Ni | 0.02 ≦ h/λ ≦ 0.2 | 0.03 ≦ h/λ ≦ 0.3 |
| Mo | 0.01 ≦ h/λ ≦ 0.2 | 0.03 ≦ h/λ ≦ 0.3 |

In the surface acoustic wave device according to a preferred embodiment of the present invention, the primary metal of the IDT electrode, the normalized thickness of the IDT electrode normalized by the wavelength λ of the surface acoustic wave, and the normalized thickness of the piezoelectric film normalized by the wavelength λ of the surface acoustic wave are preferably set within the ranges of each combination shown in the following Table 2. Thus, the absolute value of the reflection coefficient of the surface acoustic wave per electrode finger of the IDT electrode can be further increased to about 0.05 or more.

TABLE 2

| Primary metal of IDT electrode | Normalized thickness of IDT electrode | Normalized ZnO thickness |
| --- | --- | --- |
| Al | $0.06 \leq h/\lambda \leq 0.2$ | $0.03 \leq h/\lambda \leq 0.3$ |
| Au | $0.02 \leq h/\lambda \leq 0.2$ | $0.03 \leq h/\lambda \leq 0.3$ |
| Ta | $0.04 \leq h/\lambda \leq 0.2$ | $0.03 \leq h/\lambda \leq 0.3$ |
| W  | $0.04 \leq h/\lambda \leq 0.2$ | $0.03 \leq h/\lambda \leq 0.3$ |
| Pt | $0.02 \leq h/\lambda \leq 0.2$ | $0.03 \leq h/\lambda \leq 0.3$ |
| Cu | $0.06 \leq h/\lambda \leq 0.2$ | $0.03 \leq h/\lambda \leq 0.2$ |
| Ni | $0.06 \leq h/\lambda \leq 0.2$ | $0.03 \leq h/\lambda \leq 0.2$ |
| Mo | $0.06 \leq h/\lambda \leq 0.2$ | $0.03 \leq h/\lambda \leq 0.2$ |

More preferably, the primary metal of the IDT electrode, the normalized thickness of the IDT electrode normalized by the wavelength λ of the surface acoustic wave, and the normalized thickness of the piezoelectric film normalized by the wavelength λ of the surface acoustic wave are preferably set within the ranges of each combination shown in the following Table 3. In this case, the absolute value of the reflection coefficient of the surface acoustic wave per electrode finger of the IDT electrode can be further increased to 0.1 or more.

TABLE 3

| Primary metal of IDT electrode | Normalized thickness of IDT electrode | Normalized ZnO thickness |
| --- | --- | --- |
| Al | $0.1 \leq h/\lambda \leq 0.075$ | $0.03 \leq h/\lambda \leq 0.3$ |
| Au | $0.06 \leq h/\lambda \leq 0.075$ | $0.03 \leq h/\lambda \leq 0.3$ |
| Ta | $0.06 \leq h/\lambda \leq 0.075$ | $0.03 \leq h/\lambda \leq 0.3$ |
| W  | $0.06 \leq h/\lambda \leq 0.075$ | $0.03 \leq h/\lambda \leq 0.3$ |
| Pt | $0.06 \leq h/\lambda \leq 0.075$ | $0.03 \leq h/\lambda \leq 0.3$ |
| Cu | $0.06 \leq h/\lambda \leq 0.075$ | $0.03 \leq h/\lambda \leq 0.1$ |
| Ni | $0.06 \leq h/\lambda \leq 0.075$ | $0.03 \leq h/\lambda \leq 0.1$ |
| Mo | $0.06 \leq h/\lambda \leq 0.075$ | $0.03 \leq h/\lambda \leq 0.1$ |

In addition, the Euler angles of the piezoelectric substrate described above are preferably set within the ranges of (0°±5°, 105° to 140°, and 0°±40°), and in this case, a positive temperature coefficient of frequency TCF of the piezoelectric substrate composed of quartz can be effectively counteracted by a negative temperature coefficient of frequency of the piezoelectric thin film composed of ZnO, so that a surface acoustic wave device having a small absolute value of the temperature coefficient of frequency TCF can be provided.

In addition, according to another preferred embodiment of the present invention, a surface acoustic wave device which uses a Rayleigh wave as a surface acoustic wave, includes: a piezoelectric substrate composed of quartz having Euler angles of (0°±5°, 105° to 140°, and 0°±40°); an IDT electrode located on the piezoelectric substrate and which includes a plurality of electrode fingers; and a piezoelectric film arranged on the piezoelectric substrate so as to cover the IDT electrode, which is composed of c-axis oriented ZnO, and which has a convex portion provided on a surface thereof corresponding to the thickness of the ID electrode. In the surface acoustic wave device described above, the IDT electrode is composed of a laminate metal film including a plurality of metals selected from the group consisting of Al, Au, Ta, W, Pt, Cu, Ni, and Mo, and when the quotient obtained by dividing the sum of the product of a thickness T of each metal film defining the laminate metal film and the density of a metal forming each metal film by the sum of the thickness T of each metal film defining the laminate metal film is regarded as an average density, and when the wavelength of the surface acoustic wave is represented by λ, the average density, a normalized thickness of the IDT electrode, and a normalized thickness of the piezoelectric film are preferably within the ranges of each combination shown in the following Table 4.

TABLE 4

| Average density (kg/m$^3$) | Normalized thickness of IDT electrode | Normalized ZnO thickness |
| --- | --- | --- |
| 2,699  | $0.1 \leq h/\lambda \leq 0.075$  | $0.03 \leq h/\lambda \leq 0.3$ |
| 8,845  | $0.06 \leq h/\lambda \leq 0.075$ | $0.03 \leq h/\lambda \leq 0.1$ |
| 8,930  | $0.06 \leq h/\lambda \leq 0.075$ | $0.03 \leq h/\lambda \leq 0.1$ |
| 10,219 | $0.06 \leq h/\lambda \leq 0.075$ | $0.03 \leq h/\lambda \leq 0.1$ |
| 16,678 | $0.06 \leq h/\lambda \leq 0.075$ | $0.03 \leq h/\lambda \leq 0.3$ |
| 19,265 | $0.06 \leq h/\lambda \leq 0.075$ | $0.03 \leq h/\lambda \leq 0.3$ |
| 19,300 | $0.06 \leq h/\lambda \leq 0.075$ | $0.03 \leq h/\lambda \leq 0.3$ |
| 21,400 | $0.06 \leq h/\lambda \leq 0.075$ | $0.03 \leq h/\lambda \leq 0.3$ |

According to the surface acoustic wave device of a preferred embodiment of the present invention, in the structure in which the IDT electrode is formed on the piezoelectric substrate composed of quartz having specific Euler angles, and in which the piezoelectric film composed of ZnO is arranged so as to cover the IDT electrode, since the IDT electrode is composed of the metal material primarily including a specific metal, and the primary metal of the IDT electrode, the normalized thickness of the IDT electrode, and the normalized thickness of the piezoelectric film are preferably set within the ranges of each combination shown in Table 1, the absolute value of the reflection coefficient of a surface acoustic wave per electrode finger of the IDT can be increased to about 0.025 or more. Hence, a surface acoustic wave device which is a resonator type surface acoustic wave device having a laminate structure of ZnO/IDT electrode/quartz and which has a narrow bandwidth and high selectivity can be provided.

In addition, in the IDT electrode composed of a laminate metal film according to a preferred embodiment of the present invention, in the case in which, as described above, the quotient obtained by dividing the sum of the product of a thickness T of each metal film defining the laminate metal film and the density of a metal forming each metal film by the sum of the thickness T of each metal film defining the laminate metal film is regarded as the average density, and the wavelength of the surface acoustic wave is represented by λ, when the average density, the normalized thickness of the IDT electrode, and the normalized thickness of the piezoelectric film are preferably set within the ranges of each combination shown in Table 4, as in the case described above, the absolute value of the reflection coefficient of a surface acoustic wave per electrode finger of the IDT can be increased to about 0.025 or more, and a surface acoustic wave device which is a resonator type surface acoustic wave device and which has a narrow bandwidth and high selectivity can be provided.

Other features, elements, steps, characteristics and advantages of the present invention will become more apparent from the following detailed description of preferred embodiments of the present invention with reference to the attached drawings.

DETAILED DESCRIPTION OF THE PREFERRED EMBODIMENTS

Hereinafter, the present invention will be disclosed using the following preferred embodiments of the present invention with reference to the accompanying drawings.

Figure 1A:
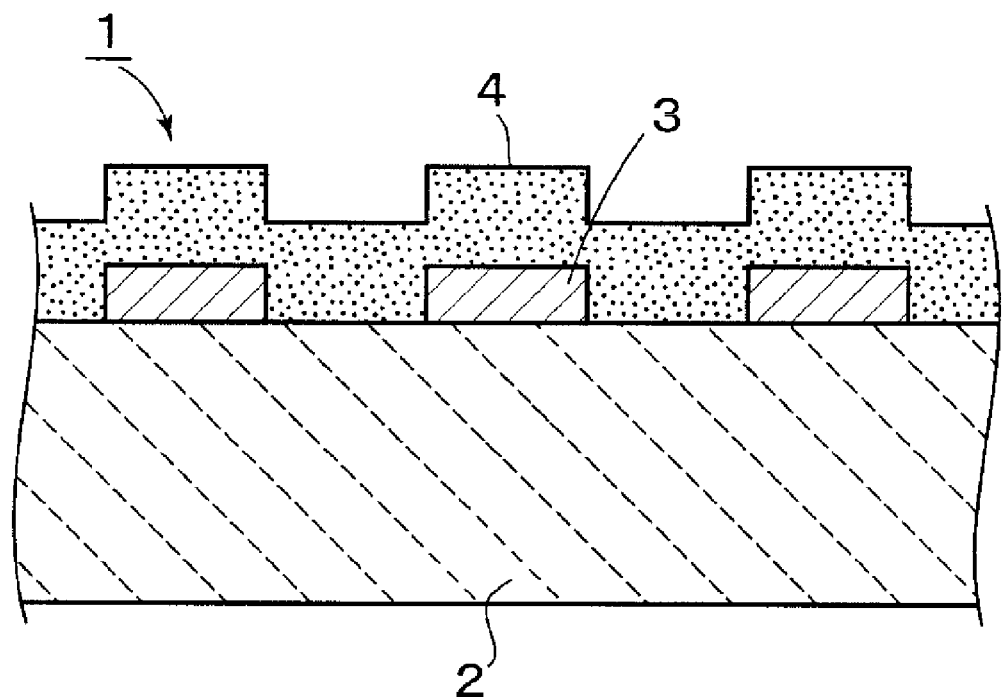
FIGS. 1A and 1B are a schematic partly cutaway front cross-sectional view of a surface acoustic wave device according to one preferred embodiment of the present invention and a schematic plan view showing an electrode structure thereof, respectively.
Figure 1B:
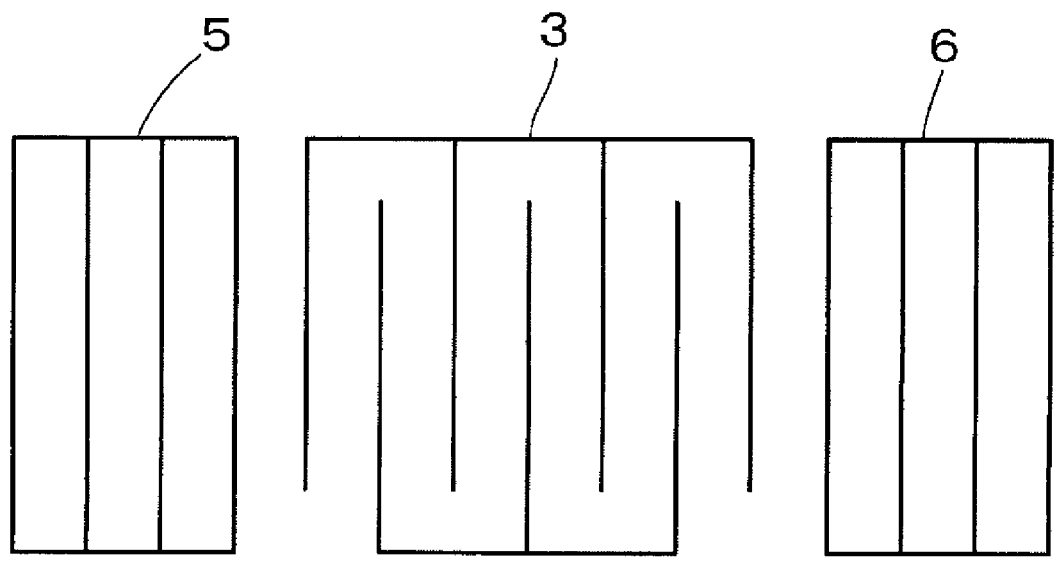

FIGS. 1A and 1B are a schematic partly cutaway front cross-sectional view of a surface acoustic wave device according to a preferred embodiment of the present invention and a schematic plan view showing an electrode structure thereof, respectively.

A surface acoustic wave device 1 has a piezoelectric substrate 2 composed of quartz having Euler angles of (0°±5°, 0° to 140°, and 0°±40°). An IDT electrode 3 is formed on the piezoelectric substrate 2. The IDT electrode 3 has a plurality of electrode fingers. A piezoelectric film 4 composed of c-axis oriented ZnO is arranged on the piezoelectric substrate 2 so as to cover the IDT electrode 3.

As apparent from FIG. 1A, convex portions corresponding to the thickness of the IDT electrode are provided on the surface of the piezoelectric film 4. In addition, as shown in FIG. 1B, reflectors 5 and 6 are disposed at two sides of the IDT electrode 3 in a surface acoustic wave propagating direction.

The surface acoustic wave device of the present preferred embodiment preferably is a multi-mode resonator-type surface acoustic wave filter or a ladder filter resonator-type surface acoustic wave filter, and as the surface acoustic wave, a Rayleigh wave is used.

In addition, the IDT electrode 3 described above is composed of a metal material primarily including at least one metal selected from the group consisting of Al, Au, Ta, W, Pt, Cu, Ni, and Mo. When the wavelength of the surface acoustic wave is represented by $\lambda$, the above primary metal material of the IDT electrode 3, a normalized thickness of the IDT electrode normalized by the wavelength of the surface acoustic wave, and a normalized thickness of the piezoelectric film normalized by the wavelength of the surface acoustic wave are preferably set within the ranges of each combination shown in the following Table 5.

TABLE 5

| Primary metal of IDT electrode | Normalized thickness of IDT electrode | Normalized ZnO thickness |
| --- | --- | --- |
| Al | $0.02 \leq h/\lambda \leq 0.2$ | $0.03 \leq h/\lambda \leq 0.3$ |
| Au | $0.005 \leq h/\lambda \leq 0.2$ | $0.03 \leq h/\lambda \leq 0.3$ |
| Ta | $0.005 \leq h/\lambda \leq 0.2$ | $0.03 \leq h/\lambda \leq 0.3$ |
| W  | $0.005 \leq h/\lambda \leq 0.2$ | $0.03 \leq h/\lambda \leq 0.3$ |
| Pt | $0.005 \leq h/\lambda \leq 0.2$ | $0.03 \leq h/\lambda \leq 0.3$ |
| Cu | $0.02 \leq h/\lambda \leq 0.2$ | $0.03 \leq h/\lambda \leq 0.3$ |
| Ni | $0.02 \leq h/\lambda \leq 0.2$ | $0.03 \leq h/\lambda \leq 0.3$ |
| Mo | $0.01 \leq h/\lambda \leq 0.2$ | $0.03 \leq h/\lambda \leq 0.3$ |

According to the present preferred embodiment, the absolute value of the reflection coefficient of the surface acoustic wave per electrode finger of the IDT electrode 3 can be increased to about 0.025 or more, and a narrow bandpass resonator type surface acoustic wave filter having a narrow fractional bandwidth can be provided.

That is, through intensive research carried out by the inventor of the present invention in which in the structure having an IDT electrode formed on a quartz substrate and a piezoelectric thin film of ZnO laminated on the IDT electrode, when the metal material forming the IDT electrode, the thickness thereof, and the thickness of the ZnO film are variously changed while the Euler angles of the quartz substrate are preferably set in the above specific ranges, it was discovered that when the above variables are preferably set in the above specific ranges, the absolute value of the reflection coefficient of a surface acoustic wave can be increased to high, such as about 0.025 or more.

FIGS. 2 to 9 are views each showing the changes in reflection coefficient per electrode finger of an IDT which are obtained in such a way that as a piezoelectric substrate composed of quartz, a quartz substrate having Euler angles (0°, 117°, 0°) is used; Al, Au, Ta, W, Pt, Cu, Ni, or Mo is used as a metal material forming an IDT electrode; and a normalized thickness of an IDT electrode composed of one of the above metals normalized by the wavelength of a surface acoustic wave and a normalized thickness of a ZnO film normalized by the wavelength of the surface acoustic wave are changed.

Figure 2:
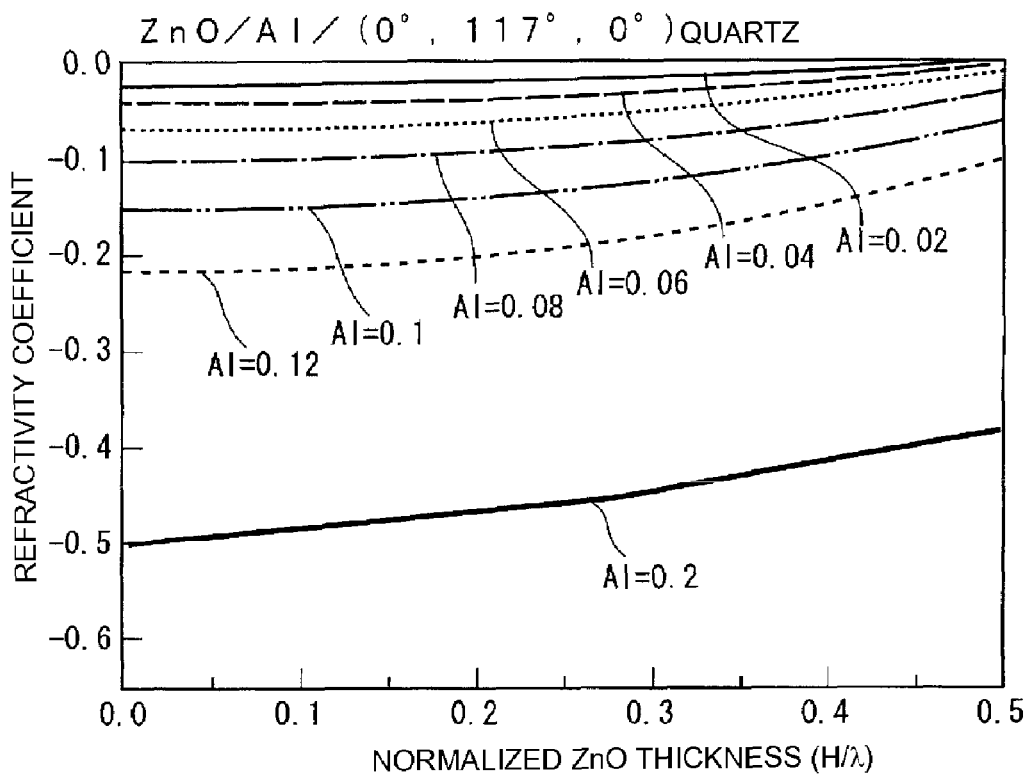
FIG. 2 is a view showing the relationship of the reflection coefficient of an electrode finger of an IDT with a normalized thickness of an IDT electrode composed of Al and a normalized thickness of a ZnO film in the structure in which the IDT electrode composed of Al and the ZnO film are laminated on a piezoelectric substrate composed of quartz having Euler angles (0°, 117°, 0°).

For example, as apparent from FIG. 2, it is found that in a laminate structure composed of ZnO/Al/quartz, when the normalized thickness of ZnO is set in the range of about 0.03 to about 0.3 with respect to all the ranges in which the normalized thickness of an IDT electrode of Al is from about 0.02 to about 0.2, the absolute value of the reflection coefficient can be increased to about 0.025 or more.

As apparent from FIGS. 3 to 9, it is found that in the case in which quartz having Euler angles (0°, 117°, 0°) is used and in which the metal forming the IDT electrode is one element selected from the group consisting of Al, Au, Ta, W, Pt, Cu, Ni, and Mo, when the normalized thickness range of the IDT electrode and the normalized thickness range of the ZnO film are preferably set to those shown in the above Table 5, the absolute value of the reflection coefficient can be increased to about 0.025 or more.

Figure 10:
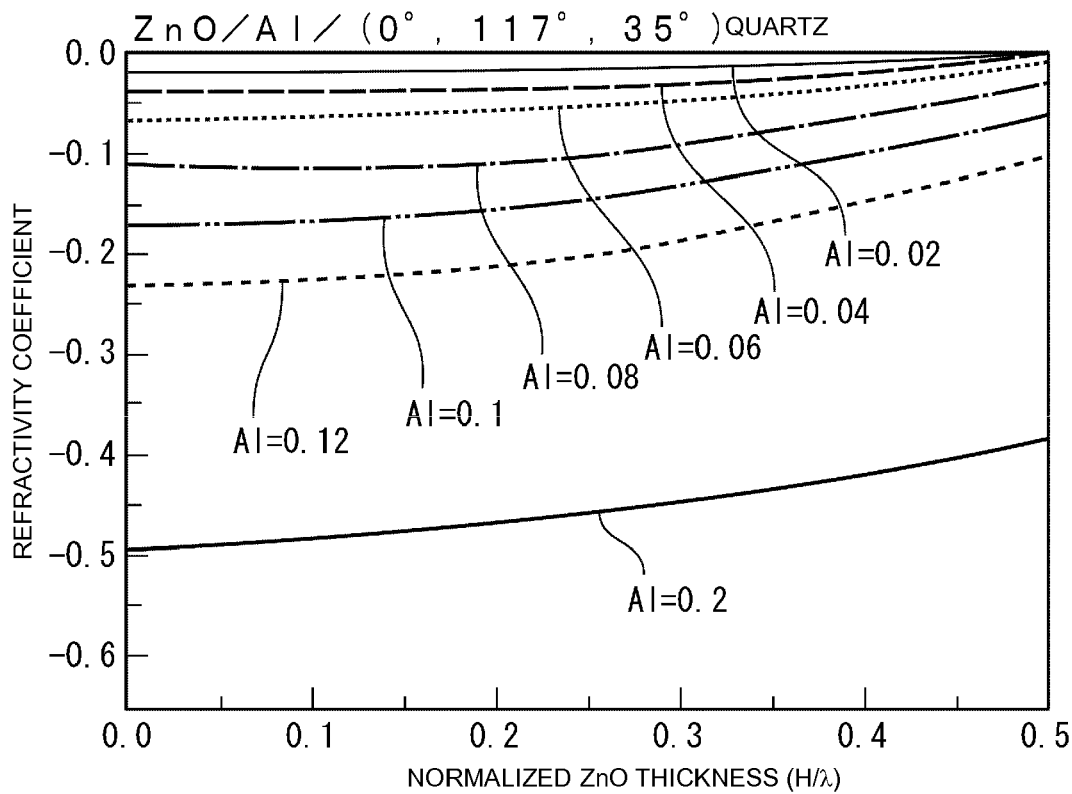
FIG. 10 is a view showing the relationship of the reflection coefficient of an IDT electrode with a normalized thickness of an IDT electrode composed of Al and a normalized thickness of a ZnO film in the structure in which the IDT electrode composed of Al and the ZnO film are laminated on a piezoelectric substrate composed of quartz having Euler angles (0°, 117°, 35°).
Figure 11:
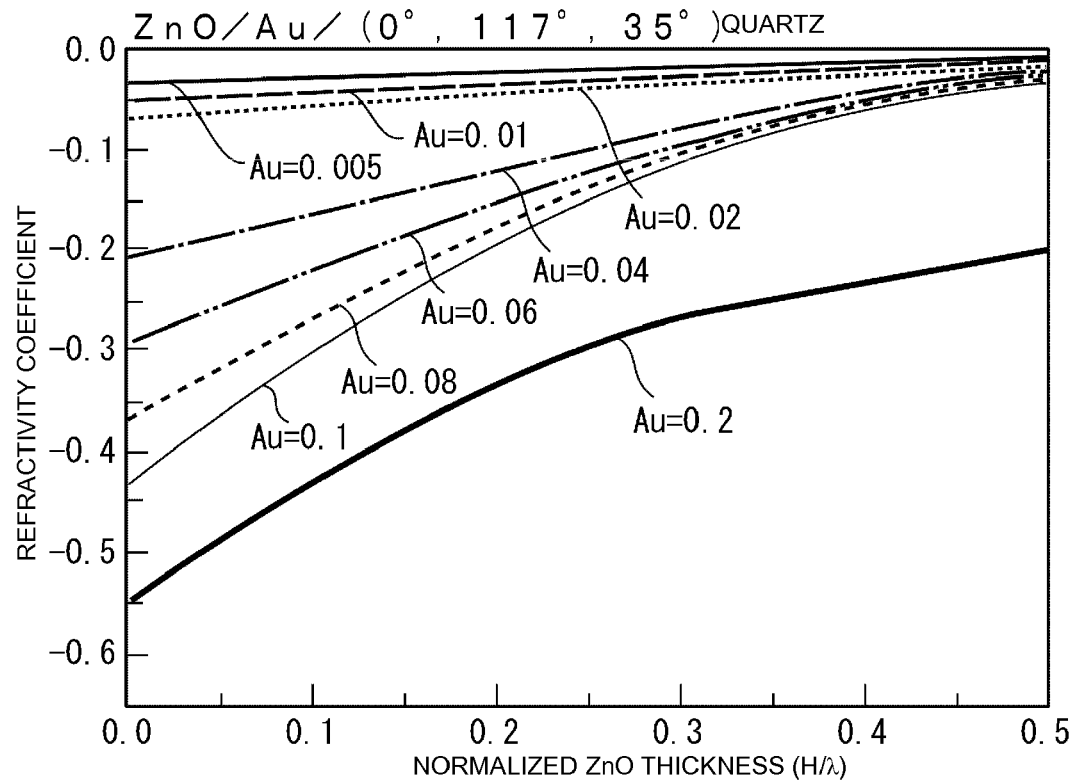
FIG. 11 is a view showing the relationship of the reflection coefficient of an IDT electrode with a normalized thickness of an IDT electrode composed of Au and a normalized thickness of a ZnO film in the structure in which the IDT electrode composed of Au and the ZnO film are laminated on a piezoelectric substrate composed of quartz having Euler angles (0°, 117°, 35°).
Figure 12:
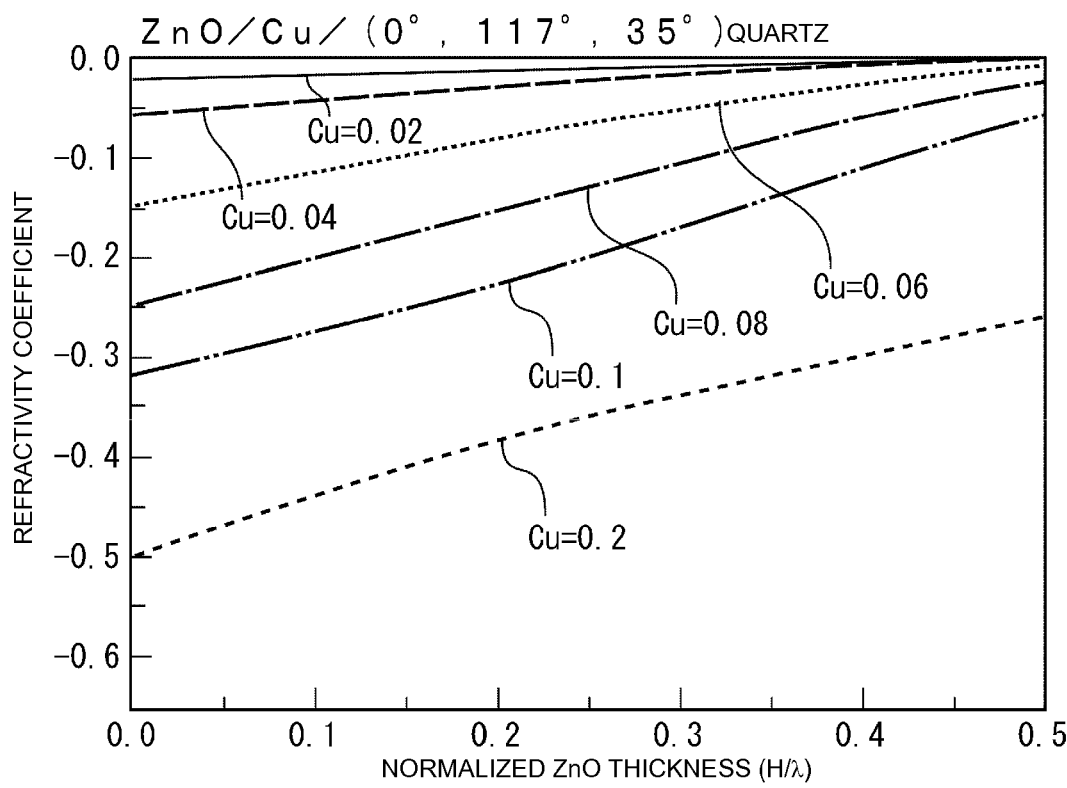
FIG. 12 is a view showing the relationship of the reflection coefficient of an IDT electrode with a normalized thickness of an IDT electrode composed of Cu and a normalized thickness of a ZnO film in the structure in which the IDT electrode composed of Cu and the ZnO film are laminated on a piezoelectric substrate composed of quartz having Euler angles (0°, 117°, 35°).

In addition, FIGS. 10 to 12 are views each showing the relationship of the reflection coefficient with the normalized thickness of the IDT electrode and the normalized thickness of the ZnO film which is obtained in such a way that an IDT electrode composed of Al, Au, or Cu is formed to have various thicknesses on a piezoelectric substrate of quartz having Euler angles (0°, 117°, 35°), and that the thickness of the ZnO thin film is variously changed.

Figure 3:
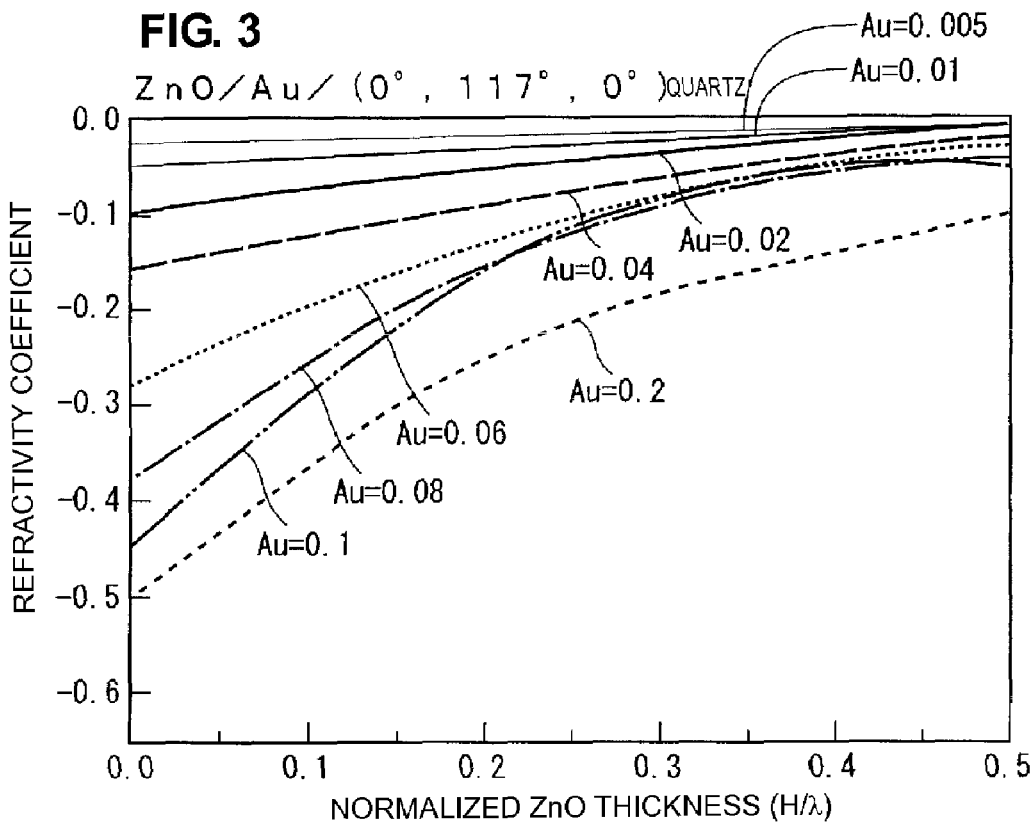
FIG. 3 is a view showing the relationship of the reflection coefficient of an electrode finger of an IDT with a normalized thickness of an IDT electrode composed of Au and a normalized thickness of a ZnO film in the structure in which the IDT electrode composed of Au and the ZnO film are laminated on a piezoelectric substrate composed of quartz having Euler angles (0°, 117°, 0°).
Figure 4:
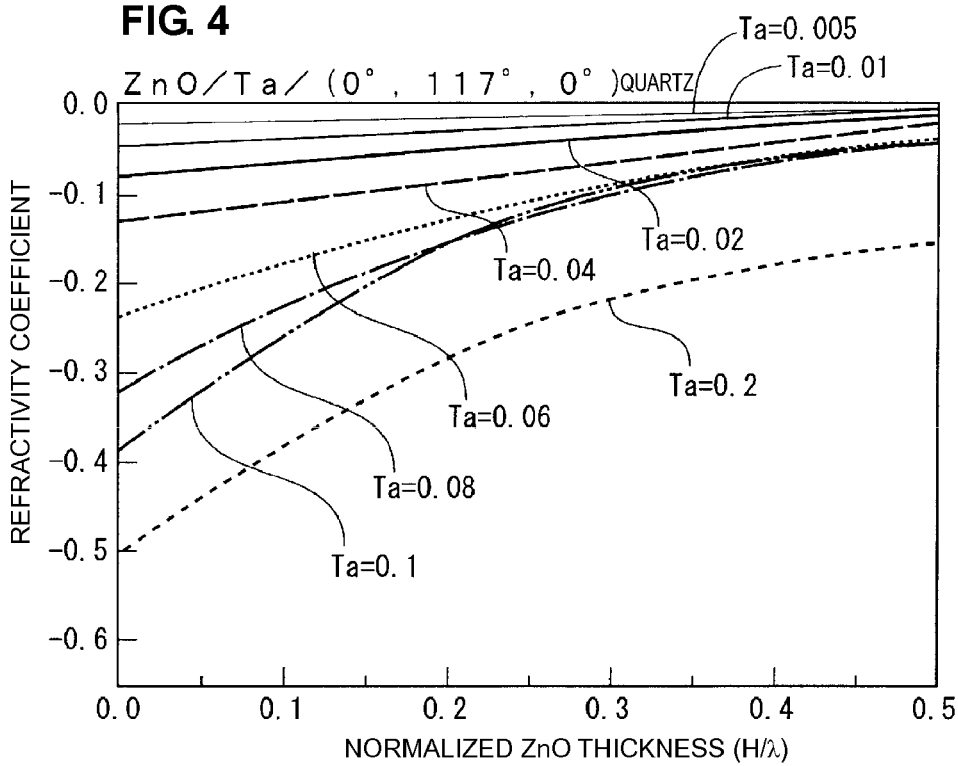
FIG. 4 is a view showing the relationship of the reflection coefficient of an electrode finger of an IDT with a normalized thickness of an IDT electrode composed of Ta and a normalized thickness of a ZnO film in the structure in which the IDT electrode composed of Ta and the ZnO film are laminated on a piezoelectric substrate composed of quartz having Euler angles (0°, 117°, 0°).
Figure 5:
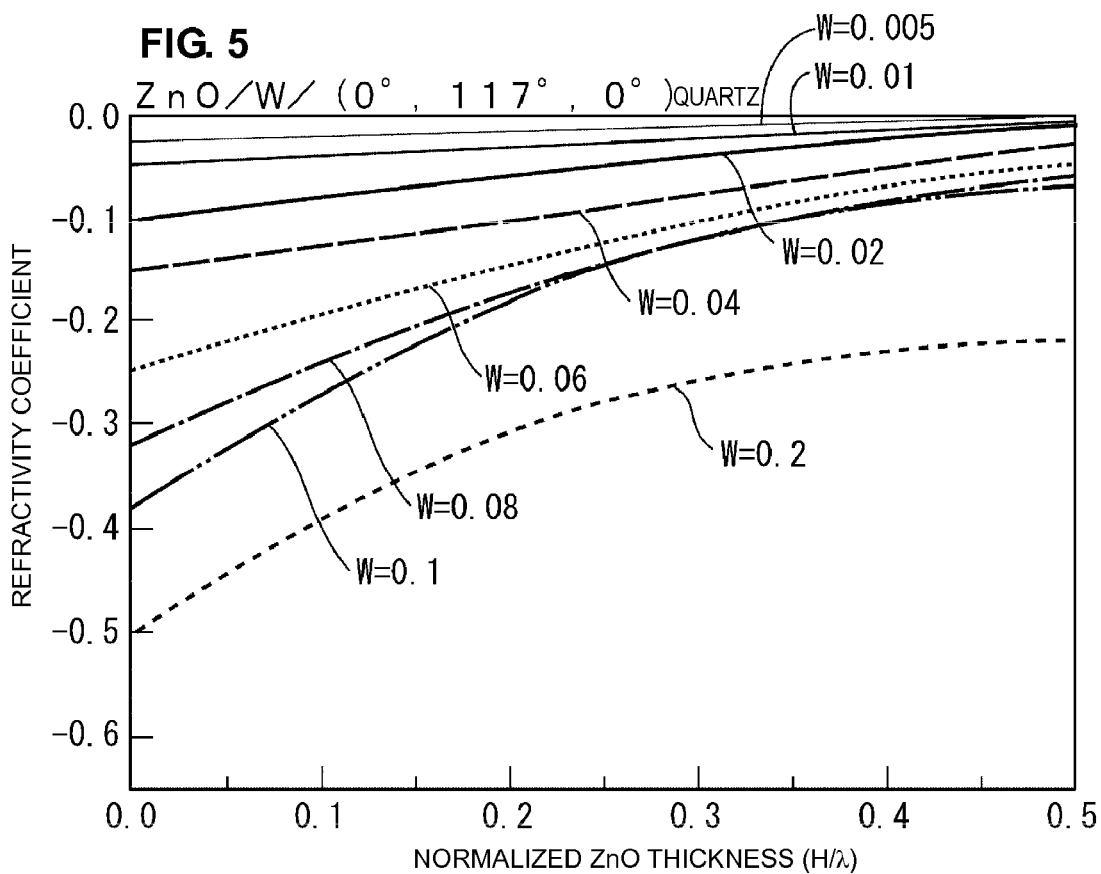
FIG. 5 is a view showing the relationship of the reflection coefficient of an electrode finger of an IDT with a normalized thickness of an IDT electrode composed of W and a normalized thickness of a ZnO film in the structure in which the IDT electrode composed of W and the ZnO film are laminated on a piezoelectric substrate composed of quartz having Euler angles (0°, 117°, 0°).
Figure 6:
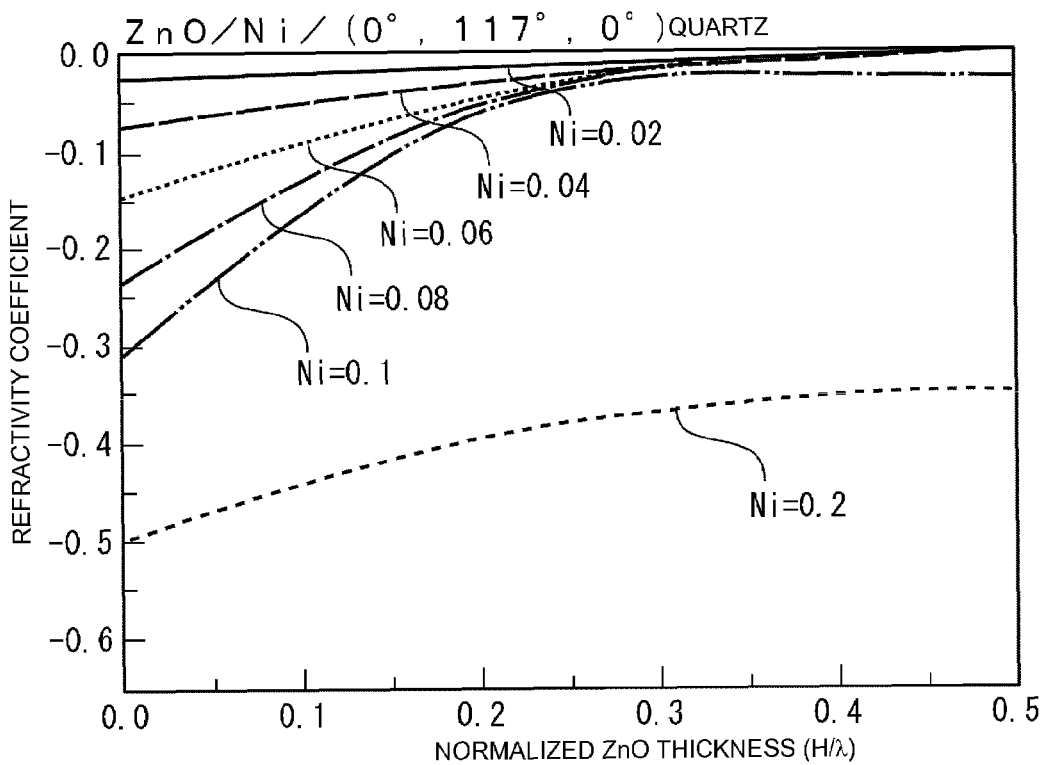
FIG. 6 is a view showing the relationship of the reflection coefficient of an electrode finger of an IDT with a normalized thickness of an IDT electrode composed of Ni and a normalized thickness of a ZnO film in the structure in which the IDT electrode composed of Ni and the ZnO film are laminated on a piezoelectric substrate composed of quartz having Euler angles (0°, 117°, 0°).
Figure 7:
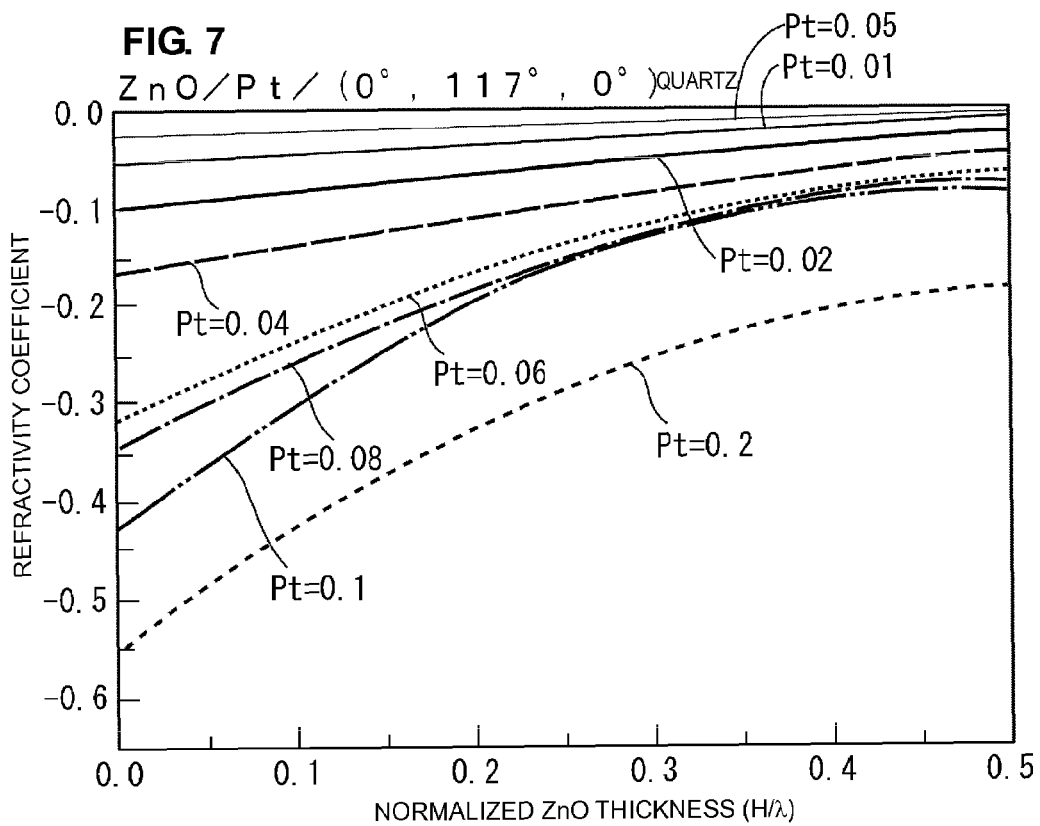
FIG. 7 is a view showing the relationship of the reflection coefficient of an electrode finger of an IDT with a normalized thickness of an IDT electrode composed of Pt and a normalized thickness of a ZnO film in the structure in which the IDT electrode composed of Pt and the ZnO film are laminated on a piezoelectric substrate composed of quartz having Euler angles (0°, 117°, 0°).
Figure 8:
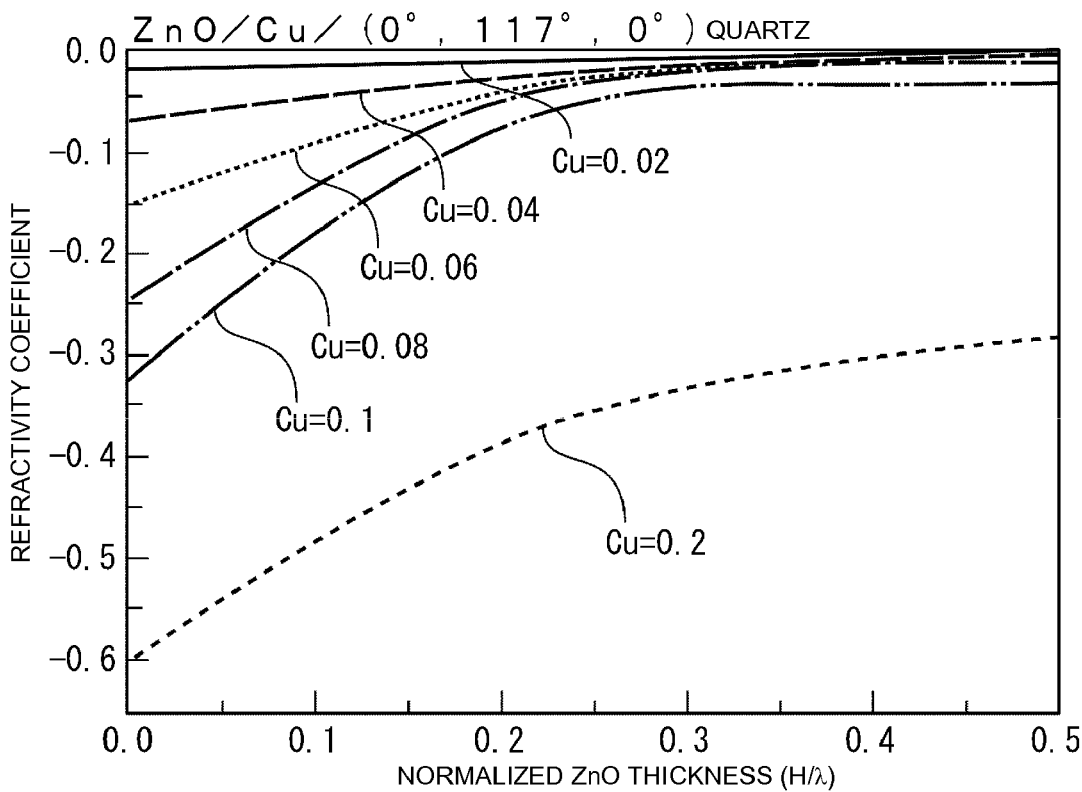
FIG. 8 is a view showing the relationship of the reflection coefficient of an electrode finger of an IDT with a normalized thickness of an IDT electrode composed of Cu and a normalized thickness of a ZnO film in the structure in which the IDT electrode composed of Cu and the ZnO film are laminated on a piezoelectric substrate composed of quartz having Euler angles (0°, 117°, 0°).
Figure 9:
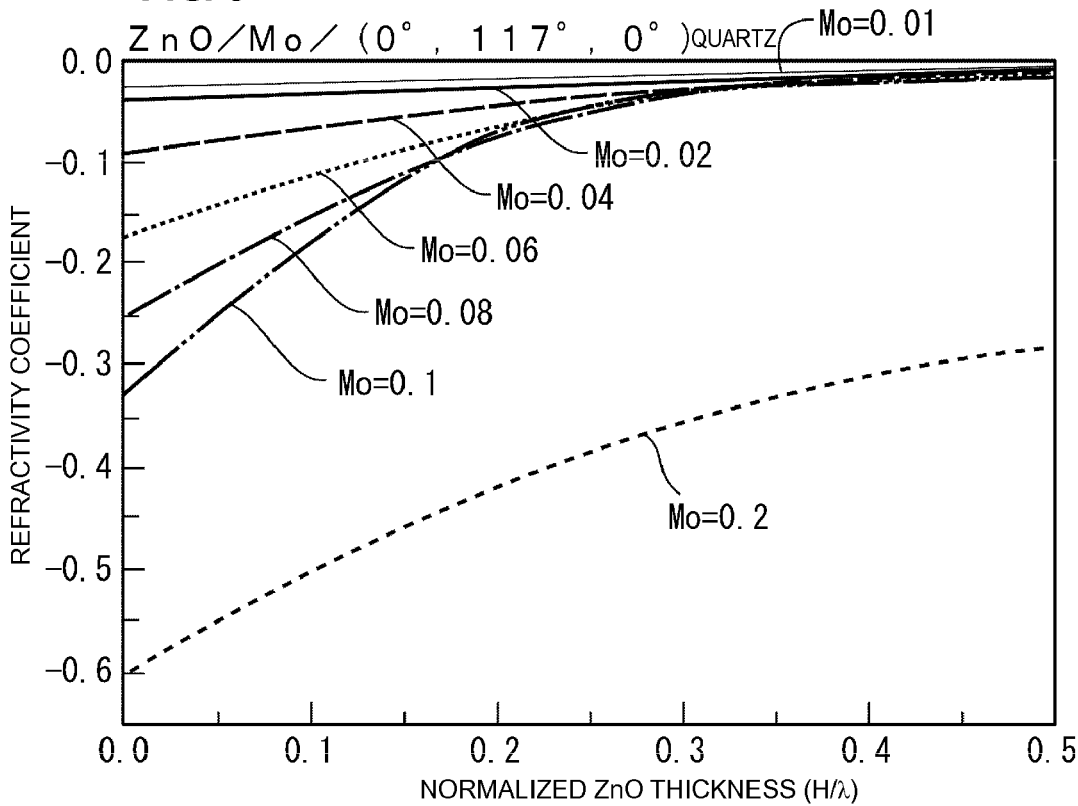
FIG. 9 is a view showing the relationship of the reflection coefficient of an electrode finger of an IDT with a normalized thickness of an IDT electrode composed of Mo and a normalized thickness of a ZnO film in the structure in which the IDT electrode composed of Mo and the ZnO film are laminated on a piezoelectric substrate composed of quartz having Euler angles (0°, 117°, 0°).

In a surface acoustic wave device formed as described above except that the quartz substrate having Euler angles (0°, 117°, 35°) is used, as in the cases shown in FIGS. 2, 3, and 8, it is found that as apparent from FIGS. 10 to 12, when the combination between the normalized thickness range of the IDT electrode and the normalized thickness range of the ZnO film is set in the ranges shown in the above Table 5, the absolute value of the reflection coefficient can be increased to about 0.025 or more. In addition, as apparent from FIGS. 2 to 12, it is found that in order to obtain a reflection coefficient of about 0.05 or more, the combination may be set in the ranges of each combination shown in the following Table 6, and that, when the combination is set in the ranges of each combination shown in the following Table 7, the absolute value of the reflection coefficient can be increased to about 0.1 or more.

TABLE 6

| Primary metal of IDT electrode | Normalized thickness of IDT electrode | Normalized ZnO thickness |
| --- | --- | --- |
| Al | $0.06 \leq h/\lambda \leq 0.2$ | $0.03 \leq h/\lambda \leq 0.3$ |
| Au | $0.02 \leq h/\lambda \leq 0.2$ | $0.03 \leq h/\lambda \leq 0.3$ |
| Ta | $0.04 \leq h/\lambda \leq 0.2$ | $0.03 \leq h/\lambda \leq 0.3$ |
| W | $0.04 \leq h/\lambda \leq 0.2$ | $0.03 \leq h/\lambda \leq 0.3$ |
| Pt | $0.02 \leq h/\lambda \leq 0.2$ | $0.03 \leq h/\lambda \leq 0.3$ |
| Cu | $0.06 \leq h/\lambda \leq 0.2$ | $0.03 \leq h/\lambda \leq 0.2$ |
| Ni | $0.06 \leq h/\lambda \leq 0.2$ | $0.03 \leq h/\lambda \leq 0.2$ |
| Mo | $0.06 \leq h/\lambda \leq 0.2$ | $0.03 \leq h/\lambda \leq 0.2$ |

TABLE 7

| Primary metal of IDT electrode | Normalized thickness of IDT electrode | Normalized ZnO thickness |
| --- | --- | --- |
| Al | $0.1 \leq h/\lambda \leq 0.075$ | $0.03 \leq h/\lambda \leq 0.3$ |
| Au | $0.06 \leq h/\lambda \leq 0.075$ | $0.03 \leq h/\lambda \leq 0.3$ |
| Ta | $0.06 \leq h/\lambda \leq 0.075$ | $0.03 \leq h/\lambda \leq 0.3$ |
| W | $0.06 \leq h/\lambda \leq 0.075$ | $0.03 \leq h/\lambda \leq 0.3$ |
| Pt | $0.06 \leq h/\lambda \leq 0.075$ | $0.03 \leq h/\lambda \leq 0.3$ |
| Cu | $0.06 \leq h/\lambda \leq 0.075$ | $0.03 \leq h/\lambda \leq 0.1$ |
| Ni | $0.06 \leq h/\lambda \leq 0.075$ | $0.03 \leq h/\lambda \leq 0.1$ |
| Mo | $0.06 \leq h/\lambda \leq 0.075$ | $0.03 \leq h/\lambda \leq 0.1$ |

In addition, when the height of the convex portion formed on the surface of the ZnO piezoelectric film to correspond to the thickness of the IDT electrode is more than about 0.08 λ, the characteristics of a surface acoustic wave device are degraded. Hence, it is preferable that the upper limit of the thickness of the IDT electrode be set to about 0.08 λ or less.

Figure 13:
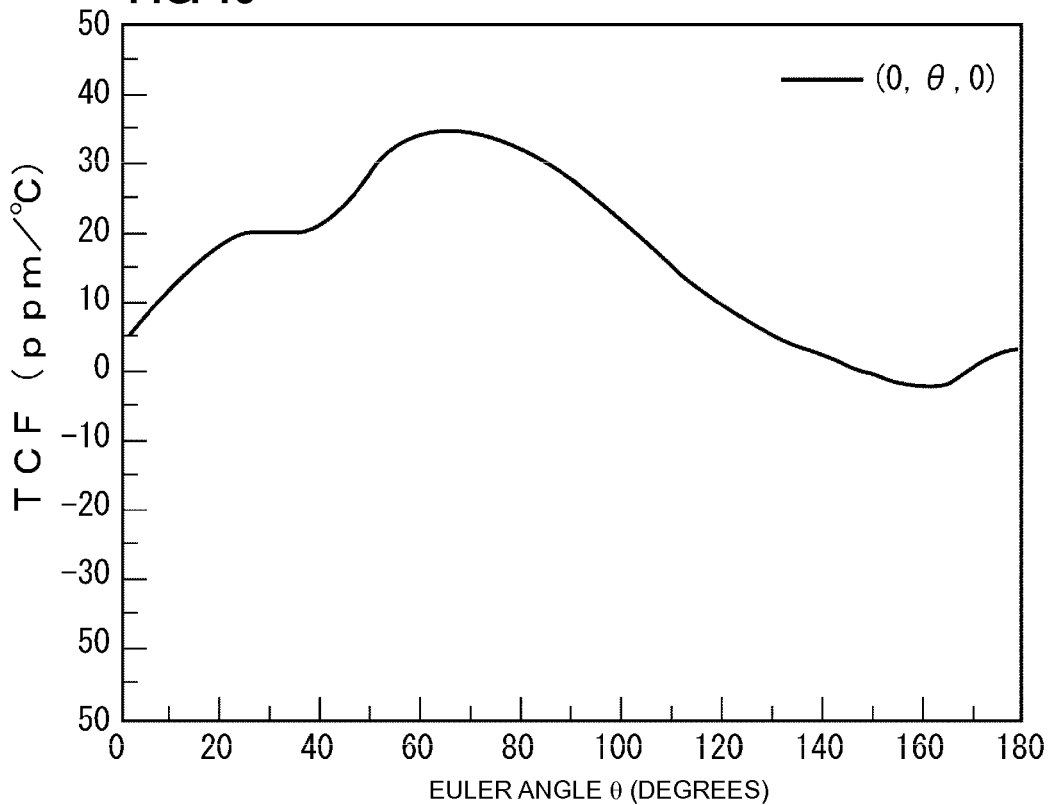
FIG. 13 is a view showing the relationship between a temperature coefficient of frequency TCF and an Euler angle θ of a piezoelectric substrate composed of quartz having Euler angles (0°, θ, 0°).

FIG. 13 is a view showing the change in temperature coefficient of frequency TCF of a Rayleigh wave which is obtained when θ of Euler angles (0°, θ, 0°) of the piezoelectric substrate 2 composed of quartz in the surface acoustic wave device 1 is changed. As apparent from FIG. 13, it is found that when θ of Euler angles (0°, θ, 0°) is in the range of 0° to 140°, the TCF is positive.

The temperature coefficient of frequency TCF of a ZnO film is a negative value. Hence, as apparent from FIG. 13, it is found that when the Euler angle θ is set in the range of 0° to 140°, the temperature coefficient of frequency TCF of quartz is counteracted by that of the ZnO film, and that a surface acoustic wave device having a small temperature coefficient of frequency TCF can be provided. Hence, the Euler angles of the piezoelectric substrate 2 composed of quartz are preferably set to (0°, 0° to 140°, 0°).

Figure 14:
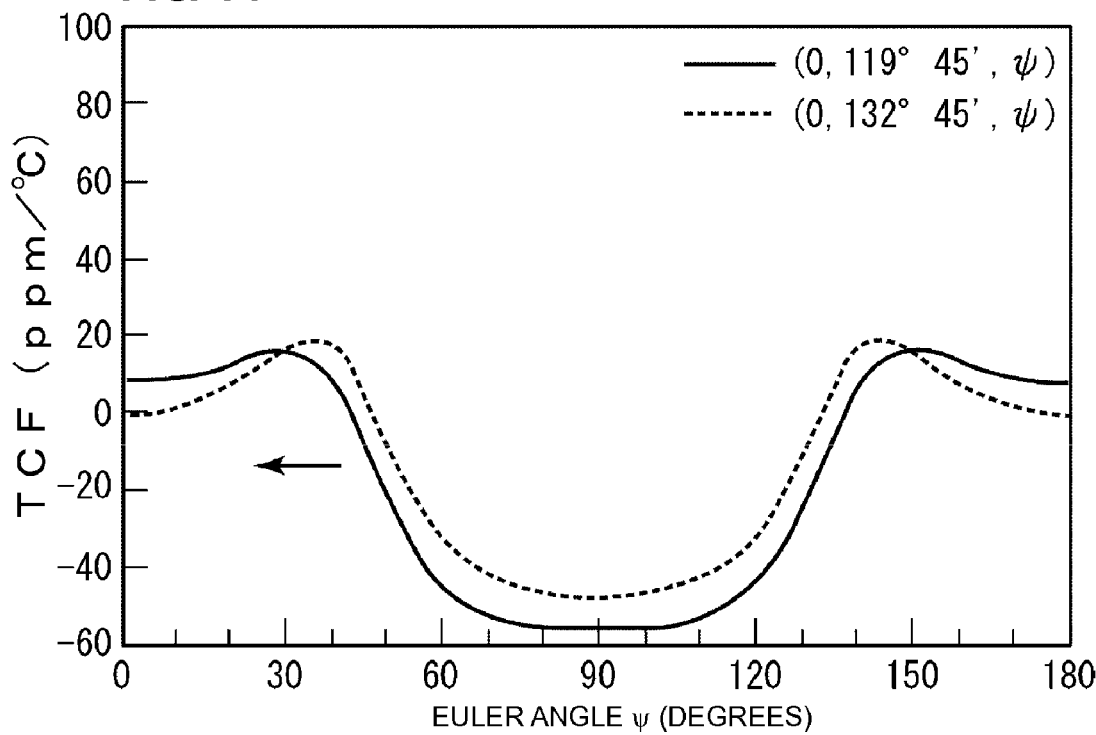
FIG. 14 is a view showing the relationship between a temperature coefficient of frequency TCF and an Euler angle ψ obtained when quartz having Euler angles (0°, 119° 45', ψ) or quartz having Euler angles (0°, 132° 45', ψ) is used.
Figure 15:
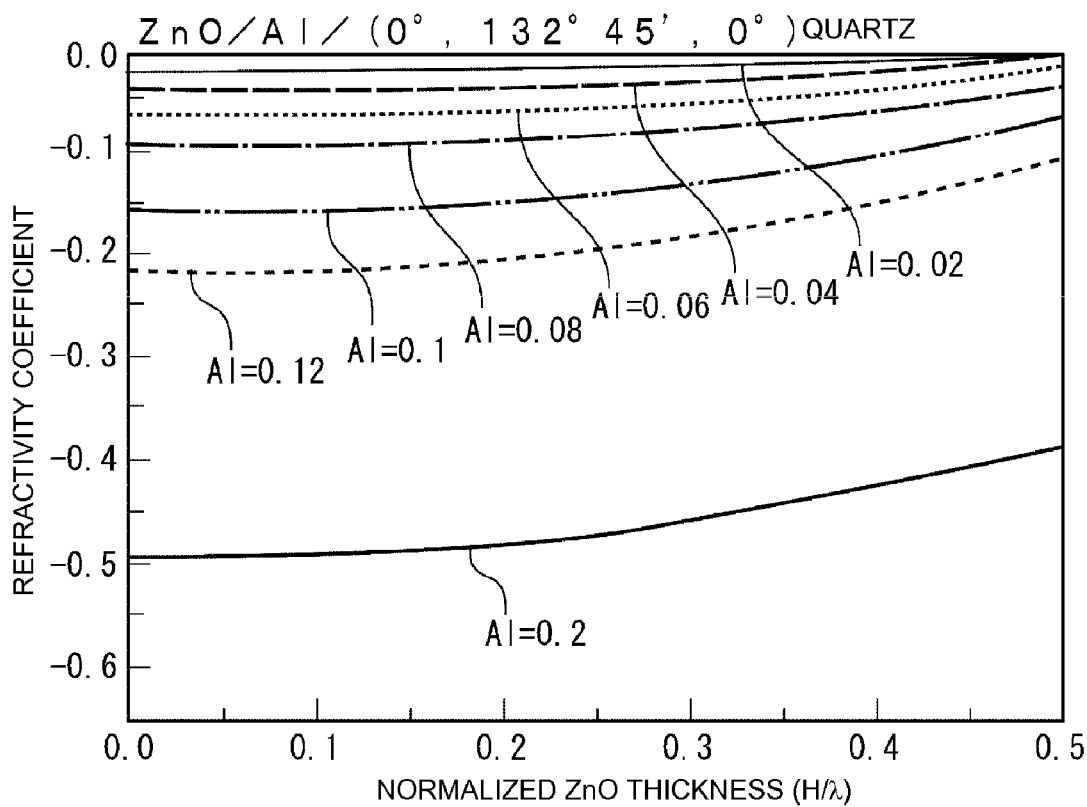
FIG. 15 is a view showing the relationship of the reflection coefficient of an electrode finger of an IDT electrode with a normalized thickness of the IDT electrode and a normalized thickness of a ZnO film in the structure in which the IDT electrode composed of Al and the ZnO film are laminated on a piezoelectric substrate composed of quartz having Euler angles (0°, 132°45', 0°).
Figure 16:
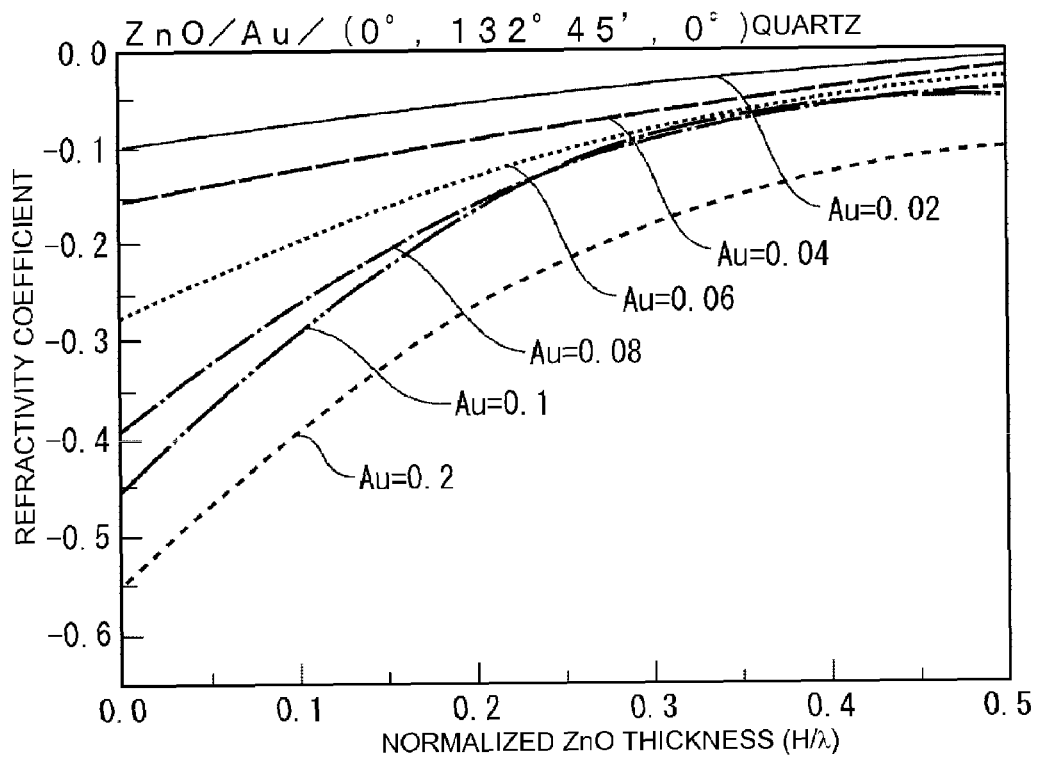
FIG. 16 is a view showing the relationship of the reflection coefficient of an electrode finger of an IDT electrode with a normalized thickness of the IDT electrode and a normalized thickness of a ZnO film in the structure in which the IDT electrode composed of Au and the ZnO film are laminated on a piezoelectric substrate composed of quartz having Euler angles (0°, 132° 45', 0°).
Figure 17:
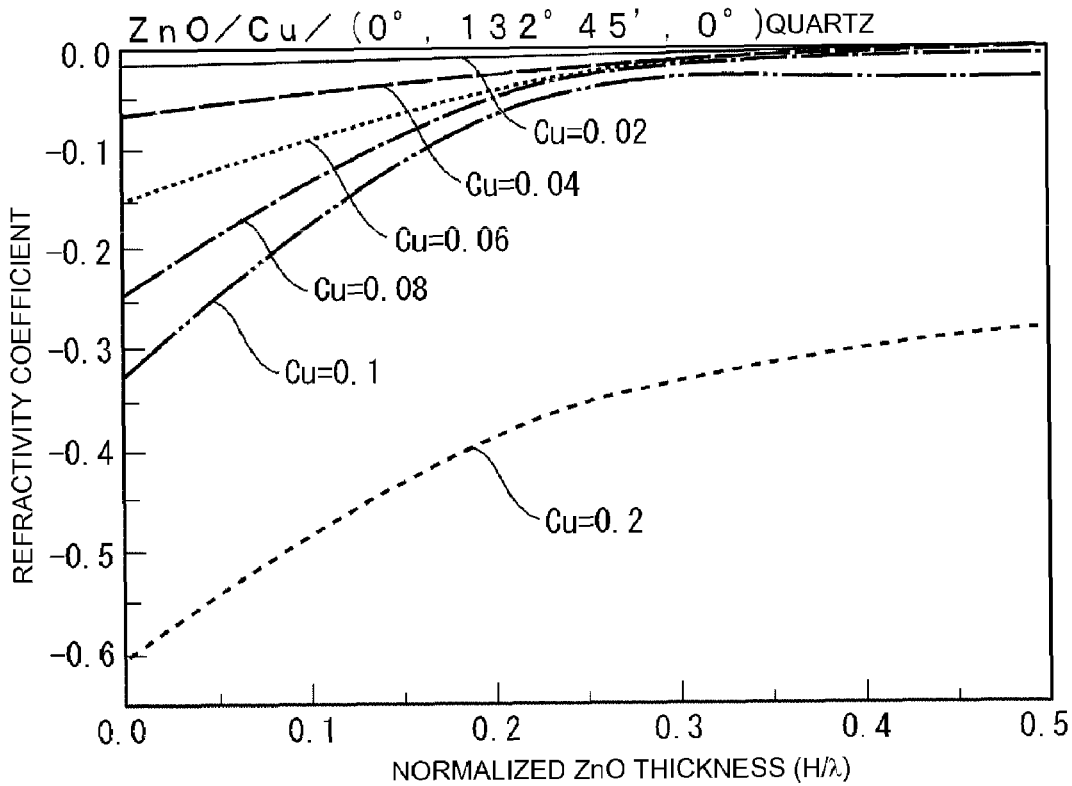
FIG. 17 is a view showing the relationship of the reflection coefficient of an electrode finger of an IDT electrode with a normalized thickness of the IDT electrode and a normalized thickness of a ZnO film in the structure in which the IDT electrode composed of Cu and the ZnO film are laminated on a piezoelectric substrate composed of quartz having Euler angles (0°, 132° 45', 0°).
Figure 18:
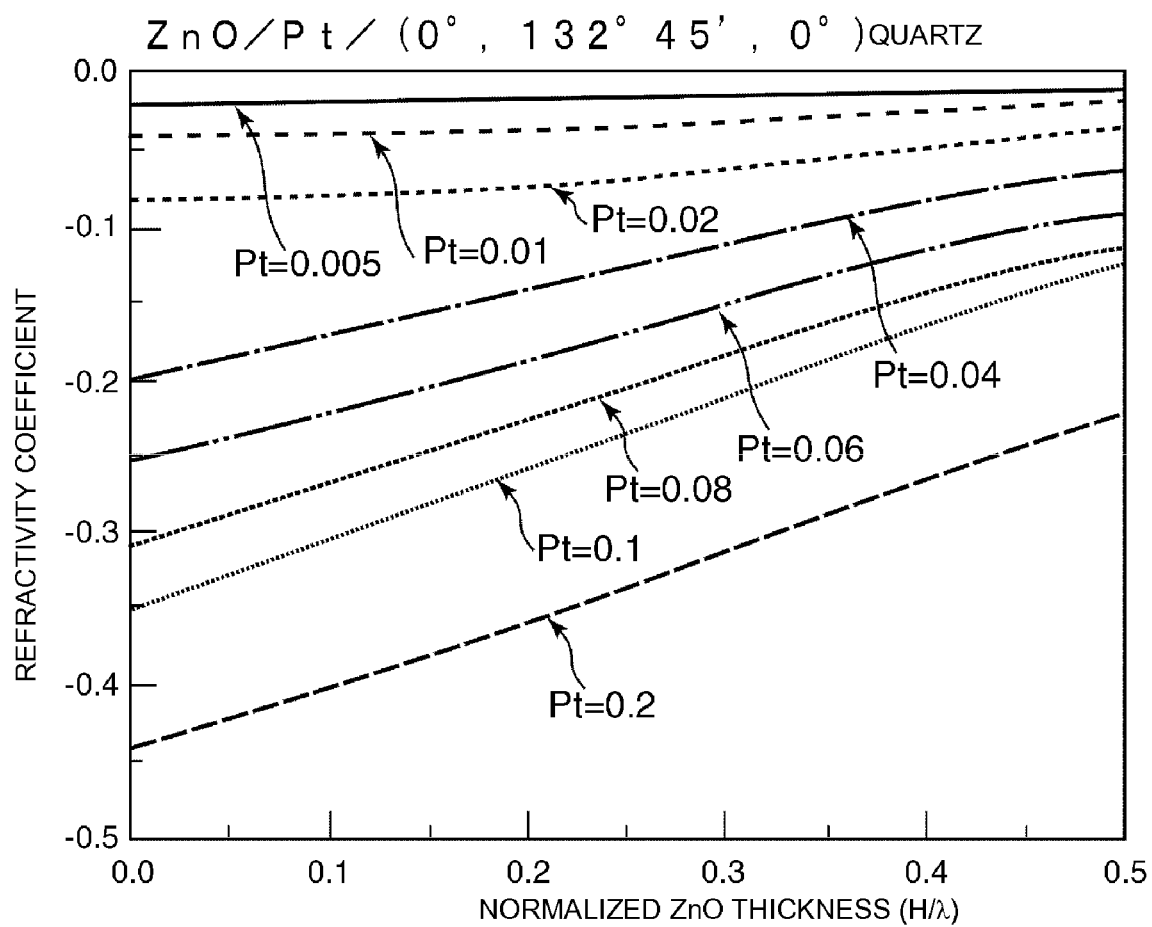
FIG. 18 is a view showing the relationship of the reflection coefficient of an electrode finger of an IDT electrode with a normalized thickness of the IDT electrode and a normalized thickness of a ZnO film in the structure in which the IDT electrode composed of Pt and the ZnO film are laminated on a piezoelectric substrate composed of quartz having Euler angles (0°, 132° 45', 0°).
Figure 19:
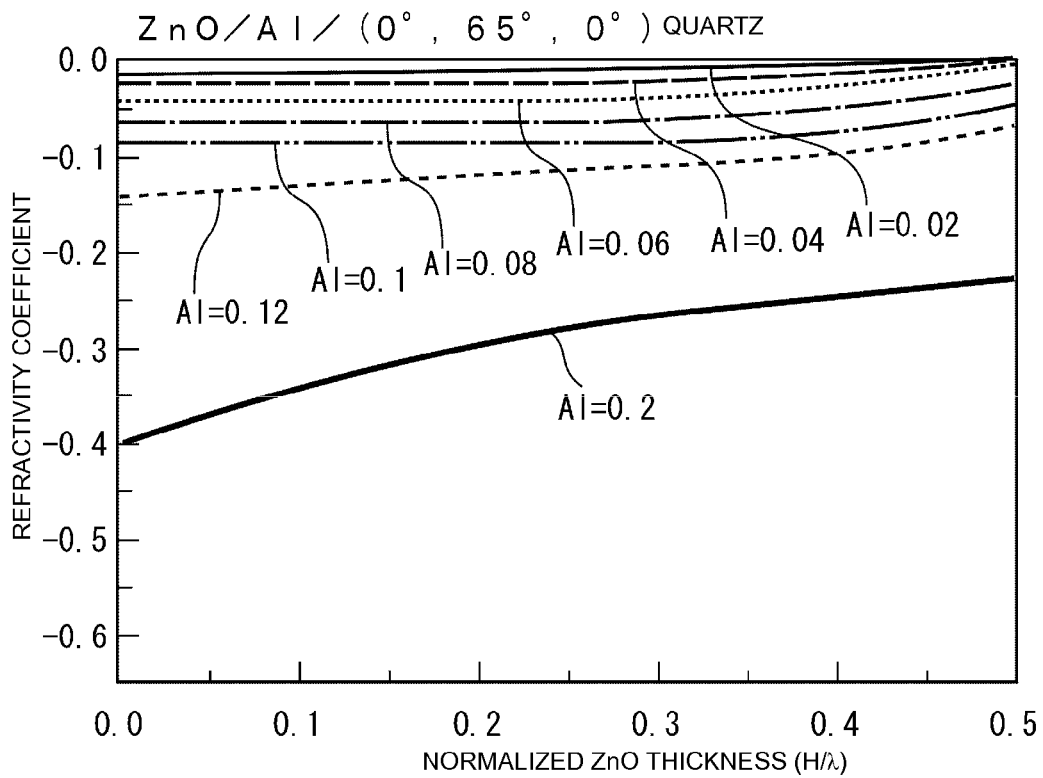
FIG. 19 is a view showing the relationship of the reflection coefficient of an electrode finger of an IDT electrode with a normalized thickness of the IDT electrode and a normalized thickness of a ZnO film in the structure in which the IDT electrode composed of Al and the ZnO film are laminated on a piezoelectric substrate composed of quartz having Euler angles (0°, 65°, 0°).
Figure 20:
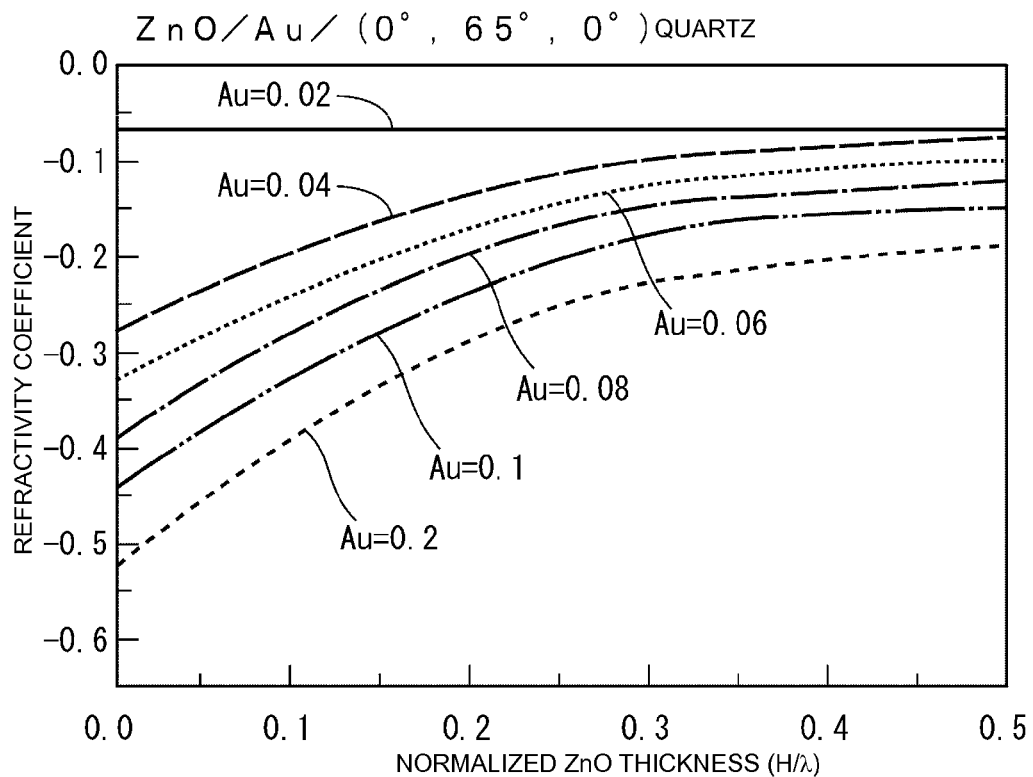
FIG. 20 is a view showing the relationship of the reflection coefficient of an electrode finger of an IDT electrode with a normalized thickness of the IDT electrode and a normalized thickness of a ZnO film in the structure in which the IDT electrode composed of Au and the ZnO film are laminated on a piezoelectric substrate composed of quartz having Euler angles (0°, 65°, 0°).
Figure 21:
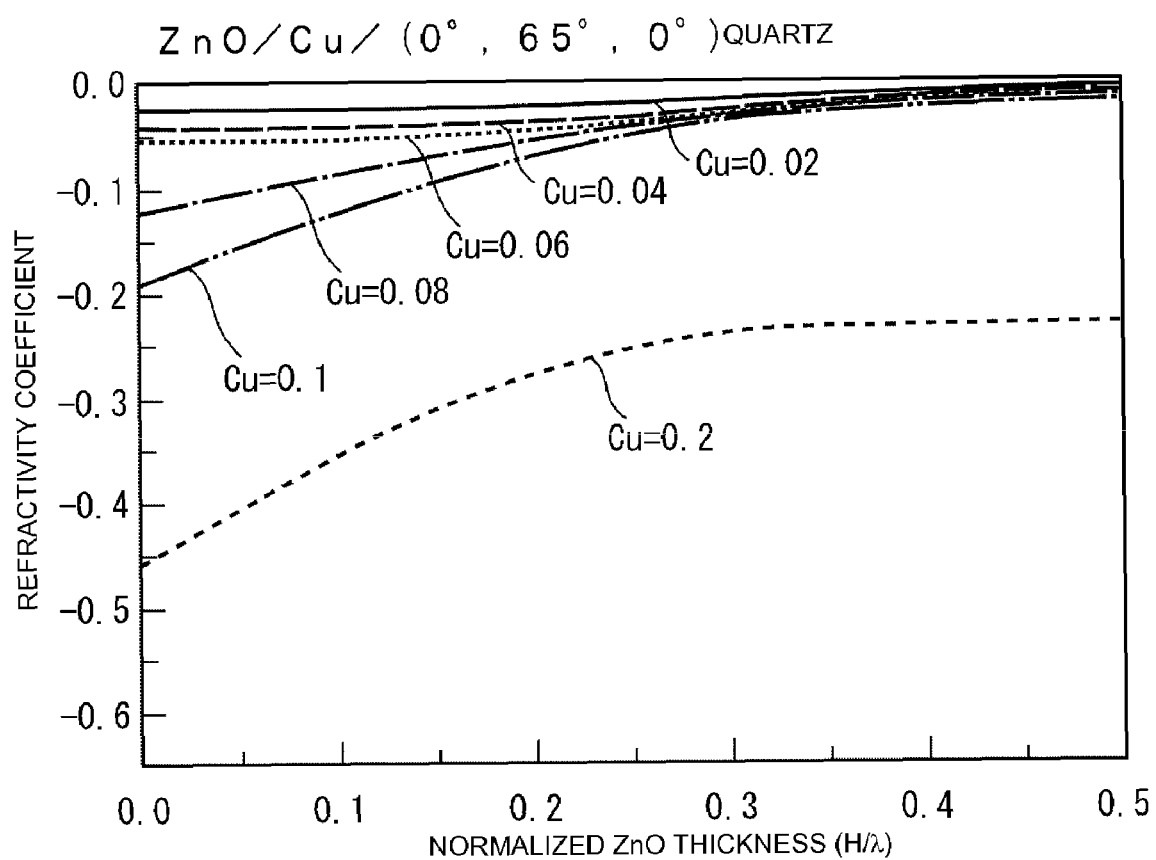
FIG. 21 is a view showing the relationship of the reflection coefficient of an electrode finger of an IDT electrode with a normalized thickness of the IDT electrode and a normalized thickness of a ZnO film in the structure in which the IDT electrode composed of Cu and the ZnO film are laminated on a piezoelectric substrate composed of quartz having Euler angles (0°, 65°, 0°).
Figure 22:
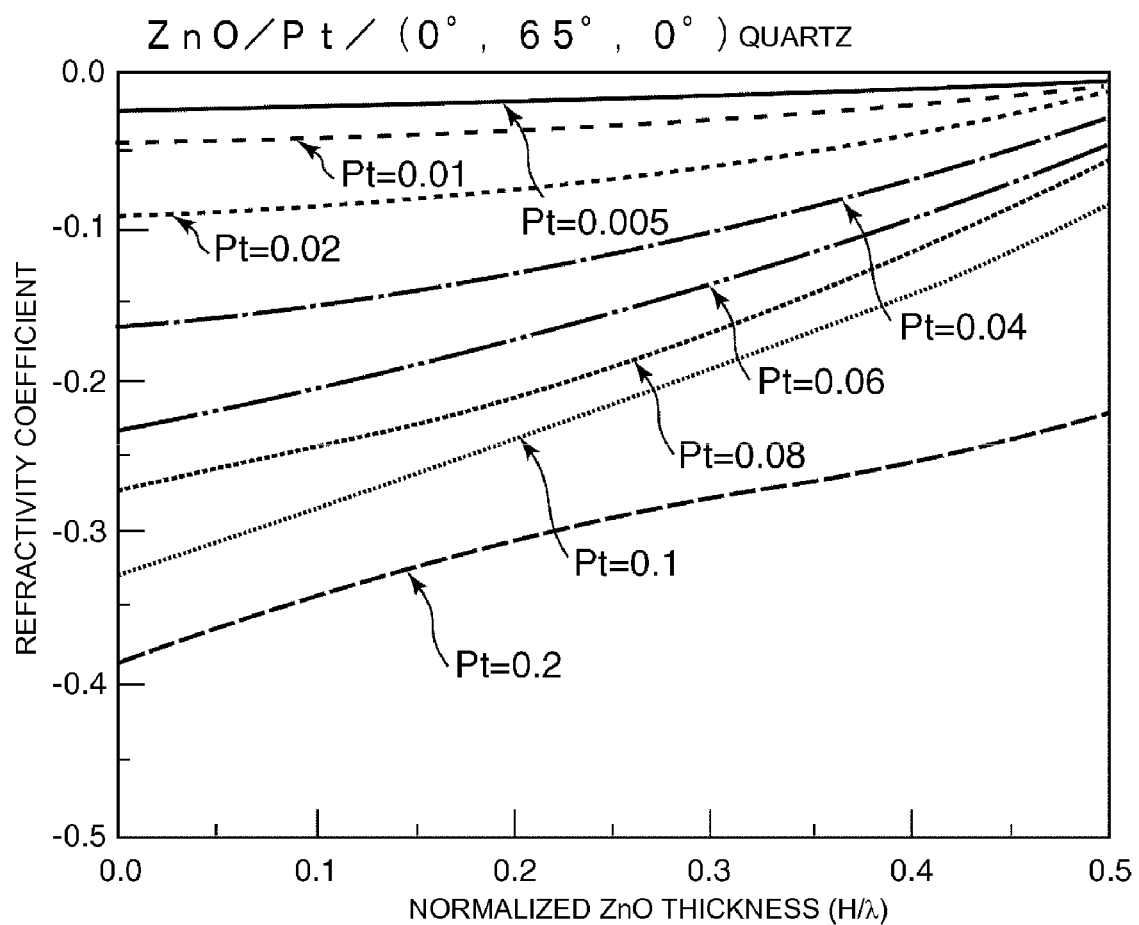
FIG. 22 is a view showing the relationship of the reflection coefficient of an electrode finger of an IDT electrode with a normalized thickness of the IDT electrode and a normalized thickness of a ZnO film in the structure in which the IDT electrode composed of Pt and the ZnO film are laminated on a piezoelectric substrate composed of quartz having Euler angles (0°, 65°, 0°).

Furthermore, FIG. 14 is a view showing the relationship between the temperature coefficient of frequency TCF and an Euler angle ψ. In this figure, the solid line indicates the result obtained when quartz having Euler angles (0°, 119° 45', ψ) is used, and the dotted line indicates the result obtained when quartz having Euler angles (0°, 132° 45', ψ) is used. As apparent from FIG. 14, it is found that when the Euler angle ψ is in the range of 0°±40°, the TCF is positive. Hence, as apparent from FIG. 14, when the Euler angle ψ is set in the range of 0°±40°, the temperature coefficient of frequency TCF of quartz can be counteracted by a negative temperature coefficient of frequency TCF of the ZnO film.

Accordingly, as apparent from FIGS. 13 and 14, it is found that in order to obtain a surface acoustic wave device having a small absolute value of the temperature coefficient of frequency TCF and stable properties with the change in temperature, the Euler angles of a piezoelectric substrate composed of quartz should be set in the range of (0°, 0° to 140°, 0°±40°).

In addition, as for an Euler angle φ, it is confirmed that when it is in the range of 0°±5°, a result approximately equivalent to that at an Euler angle φ of 0° can be obtained. Hence, the piezoelectric substrate 2 may be used which is composed of quartz having Euler angles (0°±5°, 0° to 140°, 0°±40°). The Euler angles are more preferably set in the range of (0°±5°, 105° to 140°, 0°±40°), and as a result, a surface acoustic wave device having more stable properties with the change in temperature can be provided.

FIGS. 15 to 18 are views each showing the change in reflection coefficient of the structure in which an IDT composed of Al, Au, Cu, or Pt is formed to have various thicknesses on a piezoelectric substrate composed of quartz having Euler angles (0°, 132° 45', 0°), and in which the piezoelectric film 3 composed of ZnO is formed to have various thicknesses.

As apparent from FIGS. 15 to 18, it is found that in the structure in which the IDT electrode and the ZnO film are formed to have various thicknesses on the piezoelectric substrate 2 composed of quartz having Euler angles (0°, 132° 45', 0°), reflection coefficients similar to those shown in FIGS. 2, 3, and 8 in which the Euler angles are (0°, 117°, 0°) are obtained. That is, it is found that even when the Euler angle θ is changed from 117° to 132° 45' in order to obtain a surface acoustic wave device having stable temperature properties, the reflection coefficient similar to that described above can also be realized.

FIGS. 19 to 22 are views each showing the change in reflection coefficient of the structure in which an IDT electrode composed of Al, Au, Cu, or Pt is formed to have various thicknesses on the piezoelectric substrate 2 composed of quartz having Euler angles (φ, θ, ψ)=(0°, 65°, 0°), and in which the piezoelectric film 3 composed of ZnO is formed to have various thicknesses.

As apparent from FIGS. 19 to 22, it is found that in the structure in which the IDT electrode and the ZnO film are formed to have various thicknesses on the piezoelectric substrate 2 composed of quartz having Euler angles (φ, θ, ψ)=(0°, 65°, 0°), reflection coefficients similar to those shown in FIGS. 2, 3, and 8 in which the Euler angles are (φ, θ, ψ)=(0°, 117°, 0°) are obtained. That is, it is found that even when the Euler angle θ is changed from 117° to 65° in order to obtain a surface acoustic wave device having stable temperature properties, the reflection coefficient similar to that described above can also be realized.

Hence, according to various preferred embodiments of the present invention, when the piezoelectric substrate 2 composed of quartz having Euler angles (0°±5°, 0° to 140°, 0°±40°) or preferably (0°±5°, 105° to 140°, 0°±40°) is used, the IDT electrode is formed of the above Al, Au, Ta, W, Pt, Cu, Ni, or Mo, and the normalized thickness of the IDT electrode and the normalized thickness of the ZnO film are preferably set within the ranges of each combination shown in Table 5, preferably within the ranges of each combination shown in Table 6, and more preferably within the ranges of each combination shown in Table 7, a surface acoustic wave device having a narrow bandwidth can be easily provided in which the absolute value of the temperature coefficient of frequency TCF is small, the temperature properties are stable, and the reflection coefficient of an electrode finger of the IDT electrode can be increased.

In addition, in the above described preferred embodiments, although the IDT electrode is preferably formed of Al, Au, Ta, W, Pt, Cu, Ni, or Mo, the IDT electrode is not always necessarily formed of the above pure metal. That is, the IDT electrode may be formed of a metal material primarily composed of at least one metal selected from the group consisting of Al, Au, Ta, W, Pt, Cu, Ni, and Mo.

In this case, as the metal material primarily composed of the above metal, the metal described above or an alloy primarily containing the above metal may be used. In addition, the above metal material may be composed of a laminate metal film including a plurality of metal films laminated to each other, and in this case, the primary component of the whole laminate metal film may be one metal selected from the group consisting of Al, Au, Ta, W, Pt, Cu, Ni, and Mo or an alloy primarily containing the above metal.

In various preferred embodiments of the present invention, the IDT electrode may be a laminate metal film including a plurality of metal films formed of a plurality of metals selected from the group consisting of Al, Au, Ta, W, Pt, Cu, Ni, and Mo. In this case, the normalized thickness of the IDT electrode may be determined in consideration of the average density of the laminate metal film.

A value obtained by dividing the sum of the product of a thickness T of each metal film forming a laminate metal film and a density $\rho$ shown in the following Table 8 of a metal forming each metal film by the total thickness of the laminate metal film, that is, the sum of the thickness T of each of the metal films is regarded as the average density. In addition, when the wavelength of the surface acoustic wave is represented by $\lambda$, the average density, the normalized thickness of the IDT electrode, and the normalized thickness of ZnO may preferably be set within the ranges shown in the following Table 9.

TABLE 8

| Metal | Density $\rho$ (kg/m³) |
|---|---|
| Al | 2,699 |
| Ni | 8,845 |
| Cu | 8,930 |
| Mo | 10,219 |
| Ta | 16,678 |
| W | 19,265 |
| Au | 19,300 |
| Pt | 21,400 |

TABLE 9

| Average density (kg/m³) | Normalized thickness of IDT electrode | Normalized ZnO thickness |
|---|---|---|
| 2,699 | $0.1 \leq h/\lambda \leq 0.075$ | $0.03 \leq h/\lambda \leq 0.3$ |
| 8,845 | $0.06 \leq h/\lambda \leq 0.075$ | $0.03 \leq h/\lambda \leq 0.1$ |
| 8,930 | $0.06 \leq h/\lambda \leq 0.075$ | $0.03 \leq h/\lambda \leq 0.1$ |
| 10,219 | $0.06 \leq h/\lambda \leq 0.075$ | $0.03 \leq h/\lambda \leq 0.1$ |
| 16,678 | $0.06 \leq h/\lambda \leq 0.075$ | $0.03 \leq h/\lambda \leq 0.3$ |
| 19,265 | $0.06 \leq h/\lambda \leq 0.075$ | $0.03 \leq h/\lambda \leq 0.3$ |
| 19,300 | $0.06 \leq h/\lambda \leq 0.075$ | $0.03 \leq h/\lambda \leq 0.3$ |
| 21,400 | $0.06 \leq h/\lambda \leq 0.075$ | $0.03 \leq h/\lambda \leq 0.3$ |

That is, in the case in which the laminate metal film is used, when the average density thereof is formed so as to be equal to the density of Al, Au, Ta, W, Pt, Cu, Ni, or Mo, in accordance with its density, the normalized thickness of the IDT electrode and the normalized thickness range of the ZnO film are selected from one of those shown in Table 9, so that the reflection coefficient per electrode finger can be about 0.1 or more.

In addition, when the average density of the IDT electrode composed of a laminate metal film is different from the average densities shown in the above Table 9, one combination at one of the average densities shown in Table 9 which is closest to the above density of the IDT electrode may be used instead. For example, when the thicknesses of five metal films composed of Ta, Pt, W, Au, and Mo are represented by a, b, c, d, and e, respectively, and the densities of the metal films are represented by $\rho(Ta)$, $\rho(Pt)$, $\rho(W)$, $\rho(Au)$, and $\rho(Mo)$, the average density $\rho_{ave}$ is represented by $\{a \times \rho(Ta) + b \times \rho(Pt) + c \times \rho(W) + d \times \rho(Au) + e \times \rho(Mo)\}/(a+b+c+d+e)$. The total thickness t is represented by $t = a+b+c+d+e$.

When the above normalized thicknesses a to e are approximately 0.01, 0.02, 0.03, 0.04, and 0.05, respectively, $\rho_{ave} = (2,455.68)/0.15 = 1,6371.2$ kg/m³ holds true. Since this value is closest to the density $\rho(Ta)$ of Ta, when the combination in which the average density is about 16,678 kg/m³ shown in Table 9 is used instead, the reflection coefficient can be increased to approximately 0.1 or more.

In addition, the surface acoustic wave device of the present invention is not particularly limited as long as it is a resonator type and may be applied to various resonator type surface acoustic wave filters, such as a longitudinal coupling type, and one-port type surface acoustic wave resonators.

In addition, the cross-sectional shape of the convex portion of the piezoelectric film composed of ZnO is not limited to the shape shown in FIG. 1A and, for example, may be a trapezoid shape.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A surface acoustic wave device which uses a Rayleigh wave as a surface acoustic wave, comprising:
   a piezoelectric substrate composed of quartz having Euler angles of (0°±5°, 0° to 140°, and 0°±40°);
   an IDT electrode located on the piezoelectric substrate and including a plurality of electrode fingers; and
   a piezoelectric film arranged on the piezoelectric substrate so as to cover the IDT electrode and which is composed of c-axis oriented ZnO, the piezoelectric film having a convex portion provided on a surface thereof corresponding to the thickness of the IDT electrode; wherein
   the IDT electrode is composed of a metal material primarily including at least one metal selected from the group consisting of Al, Au, Ta, W, Pt, Cu, Ni, and Mo, and when the wavelength of the surface acoustic wave is represented by $\lambda$, the primary metal of the IDT electrode, a normalized thickness of the IDT electrode normalized by the wavelength of the surface acoustic wave, and a normalized thickness of the piezoelectric film normalized by the wavelength of the surface acoustic wave are within the ranges of each combination shown in the following Table 1:

TABLE 1

| Primary metal of IDT electrode | Normalized thickness of IDT electrode | Normalized ZnO thickness |
|---|---|---|
| Al | $0.02 \leq h/\lambda \leq 0.2$ | $0.03 \leq h/\lambda \leq 0.3$ |
| Au | $0.005 \leq h/\lambda \leq 0.2$ | $0.03 \leq h/\lambda \leq 0.3$ |
| Ta | $0.005 \leq h/\lambda \leq 0.2$ | $0.03 \leq h/\lambda \leq 0.3$ |
| W | $0.005 \leq h/\lambda \leq 0.2$ | $0.03 \leq h/\lambda \leq 0.3$ |
| Pt | $0.005 \leq h/\lambda \leq 0.2$ | $0.03 \leq h/\lambda \leq 0.3$ |
| Cu | $0.02 \leq h/\lambda \leq 0.2$ | $0.03 \leq h/\lambda \leq 0.3$ |

TABLE 1-continued

| Primary metal of IDT electrode | Normalized thickness of IDT electrode | Normalized ZnO thickness |
|---|---|---|
| Ni | 0.02 ≦ h/λ ≦ 0.2 | 0.03 ≦ h/λ ≦ 0.3 |
| Mo | 0.01 ≦ h/λ ≦ 0.2 | 0.03 ≦ h/λ ≦ 0.3. |

2. The surface acoustic wave device according to claim 1, wherein the primary metal of the IDT electrode, the normalized thickness of the IDT electrode normalized by the wavelength λ of the surface acoustic wave, and the normalized thickness of the piezoelectric film normalized by the wavelength λ of the surface acoustic wave are within the ranges of each combination shown in the following Table 2:

TABLE 2

| Primary metal of IDT electrode | Normalized thickness of IDT electrode | Normalized ZnO thickness |
|---|---|---|
| Al | 0.06 ≦ h/λ ≦ 0.2 | 0.03 ≦ h/λ ≦ 0.3 |
| Au | 0.02 ≦ h/λ ≦ 0.2 | 0.03 ≦ h/λ ≦ 0.3 |
| Ta | 0.04 ≦ h/λ ≦ 0.2 | 0.03 ≦ h/λ ≦ 0.3 |
| W  | 0.04 ≦ h/λ ≦ 0.2 | 0.03 ≦ h/λ ≦ 0.3 |
| Pt | 0.02 ≦ h/λ ≦ 0.2 | 0.03 ≦ h/λ ≦ 0.3 |
| Cu | 0.06 ≦ h/λ ≦ 0.2 | 0.03 ≦ h/λ ≦ 0.2 |
| Ni | 0.06 ≦ h/λ ≦ 0.2 | 0.03 ≦ h/λ ≦ 0.2 |
| Mo | 0.06 ≦ h/λ ≦ 0.2 | 0.03 ≦ h/λ ≦ 0.2. |

3. The surface acoustic wave device according to claim 1, wherein the primary metal of the IDT electrode, the normalized thickness of the IDT electrode normalized by the wavelength λ of the surface acoustic wave, and the normalized thickness of the piezoelectric film normalized by the wavelength λ of the surface acoustic wave are within the ranges of each combination shown in the following Table 3:

TABLE 3

| Primary metal of IDT electrode | Normalized thickness of IDT electrode | Normalized ZnO thickness |
|---|---|---|
| Al | 0.1 ≦ h/λ ≦ 0.075 | 0.03 ≦ h/λ ≦ 0.3 |
| Au | 0.06 ≦ h/λ ≦ 0.075 | 0.03 ≦ h/λ ≦ 0.3 |
| Ta | 0.06 ≦ h/λ ≦ 0.075 | 0.03 ≦ h/λ ≦ 0.3 |
| W  | 0.06 ≦ h/λ ≦ 0.075 | 0.03 ≦ h/λ ≦ 0.3 |
| Pt | 0.06 ≦ h/λ ≦ 0.075 | 0.03 ≦ h/λ ≦ 0.3 |
| Cu | 0.06 ≦ h/λ ≦ 0.075 | 0.03 ≦ h/λ ≦ 0.1 |
| Ni | 0.06 ≦ h/λ ≦ 0.075 | 0.03 ≦ h/λ ≦ 0.1 |
| Mo | 0.06 ≦ h/λ ≦ 0.075 | 0.03 ≦ h/λ ≦ 0.1. |

4. The surface acoustic wave device according to claim 1, wherein the Euler angles of the piezoelectric substrate composed of quartz are within the ranges of (0°±5°, 105° to 140°, and 0°±40°).

5. The surface acoustic wave device according to claim 1, wherein the metal material primarily includes at least one metal selected from the group consisting of Al, Au, Ta, W, Pt, Cu, Ni, and Mo or an alloy primarily containing at least one of the metals.

6. The surface acoustic wave device according to claim 1, wherein the metal material is composed of a laminate metal film including a plurality of metal films laminated to each other, and the laminate metal film primarily includes at least one metal selected from the group consisting of Al, Au, Ta, W, Pt, Cu, Ni, and Mo or an alloy primarily containing at least one of the metals.

7. A surface acoustic wave device which uses a Rayleigh wave as a surface acoustic wave, comprising:
   a piezoelectric substrate composed of quartz having Euler angles of (0°±5°, 105° to 140°, and 0°±40°);
   an IDT electrode located on the piezoelectric substrate and including a plurality of electrode fingers; and
   a piezoelectric film arranged on the piezoelectric substrate so as to cover the IDT electrode and which is composed of c-axis oriented ZnO, the piezoelectric film having a convex portion provided on a surface thereof corresponding to the thickness of the IDT electrode; wherein
   the IDT electrode is composed of a laminate metal film including a plurality of metals selected from the group consisting of Al, Au, Ta, W, Pt, Cu, Ni, and Mo, and
   when a quotient obtained by dividing a sum of a product of a thickness T of each metal film forming the laminate metal film and the density of a metal forming each metal film by the sum of the thickness T of each metal film forming the laminate metal film is regarded as an average density, and when the wavelength of the surface acoustic wave is represented by λ, the average density, a normalized thickness of the IDT electrode, and a normalized thickness of the piezoelectric film are within the ranges of each combination shown in the following Table 4:

TABLE 4

| Average density (kg/m³) | Normalized thickness of IDT electrode | Normalized ZnO thickness |
|---|---|---|
| 2,699 | 0.1 ≦ h/λ ≦ 0.075 | 0.03 ≦ h/λ ≦ 0.3 |
| 8,845 | 0.06 ≦ h/λ ≦ 0.075 | 0.03 ≦ h/λ ≦ 0.1 |
| 8,930 | 0.06 ≦ h/λ ≦ 0.075 | 0.03 ≦ h/λ ≦ 0.1 |
| 10,219 | 0.06 ≦ h/λ ≦ 0.075 | 0.03 ≦ h/λ ≦ 0.1 |
| 16,678 | 0.06 ≦ h/λ ≦ 0.075 | 0.03 ≦ h/λ ≦ 0.3 |
| 19,265 | 0.06 ≦ h/λ ≦ 0.075 | 0.03 ≦ h/λ ≦ 0.3 |
| 19,300 | 0.06 ≦ h/λ ≦ 0.075 | 0.03 ≦ h/λ ≦ 0.3 |
| 21,400 | 0.06 ≦ h/λ ≦ 0.075 | 0.03 ≦ h/λ ≦ 0.3. |

* * * * *